United States Patent
Park

(10) Patent No.: US 9,646,977 B2
(45) Date of Patent: May 9, 2017

(54) NONVOLATILE MEMORY DEVICE AND METHOD FOR FABRICATING THE SAME

(71) Applicant: SK hynix Inc., Icheon (KR)

(72) Inventor: Sung-Kun Park, Icheon (KR)

(73) Assignee: SK HYNIX INC., Icheon (KR)

(*) Notice: Subject to any disclaimer, the term of this patent is extended or adjusted under 35 U.S.C. 154(b) by 0 days.

(21) Appl. No.: 14/721,970

(22) Filed: May 26, 2015

(65) Prior Publication Data
US 2015/0255472 A1 Sep. 10, 2015

Related U.S. Application Data

(63) Continuation of application No. 13/873,681, filed on Apr. 30, 2013, now Pat. No. 9,070,781.

(30) Foreign Application Priority Data

Dec. 21, 2012 (KR) ...................... 10-2012-00151093

(51) Int. Cl.
| | | |
|---|---|---|
| *H01L 27/115* | (2006.01) | |
| *H01L 21/8247* | (2006.01) | |
| *H01L 27/11517* | (2017.01) | |
| *H01L 29/788* | (2006.01) | |
| *H01L 27/11521* | (2017.01) | |
| *H01L 27/11541* | (2017.01) | |
| *H01L 29/423* | (2006.01) | |
| *H01L 27/11519* | (2017.01) | |
| *H01L 27/11546* | (2017.01) | |
| *H01L 27/11558* | (2017.01) | |
| *H01L 27/092* | (2006.01) | |

(52) U.S. Cl.
CPC .. *H01L 27/11517* (2013.01); *H01L 27/11521* (2013.01); *H01L 27/11541* (2013.01); *H01L 29/42324* (2013.01); *H01L 29/7881* (2013.01); *H01L 29/7884* (2013.01); *H01L 27/092* (2013.01); *H01L 27/11519* (2013.01); *H01L 27/11546* (2013.01); *H01L 27/11558* (2013.01)

(58) Field of Classification Search
CPC ................................................ H01L 27/11541
See application file for complete search history.

(56) References Cited

U.S. PATENT DOCUMENTS

| | | | |
|---|---|---|---|
| 2007/0241378 A1 | 10/2007 | Aritome | |
| 2008/0144377 A1* | 6/2008 | Watanabe | .......... G11C 16/0408 |
| | | | 365/185.05 |

(Continued)

FOREIGN PATENT DOCUMENTS

KR 10-2005-0005057 A 1/2005

OTHER PUBLICATIONS

Office Action from Taiwanese Patent Office for Application No. 102128077, dated Oct. 27, 2016.

*Primary Examiner* — Robert Bachner
*Assistant Examiner* — Molly Reida

(57) ABSTRACT

A nonvolatile memory device includes a floating gate formed over a substrate; a contact plug formed on a first side of the floating gate and disposed parallel to the floating gate with a gap defined therebetween; and a spacer formed on a sidewall of the floating gate and filling the gap, wherein the contact plug and the floating gate have a sufficiently large overlapping area to enable the contact plug to operate as a control gate for the floating gate.

23 Claims, 13 Drawing Sheets

(56) References Cited

U.S. PATENT DOCUMENTS

2008/0283893 A1* 11/2008 Shih .................... H01L 23/5258
257/314
2009/0231921 A1* 9/2009 Kimura ............. H01L 27/11568
365/185.18

* cited by examiner

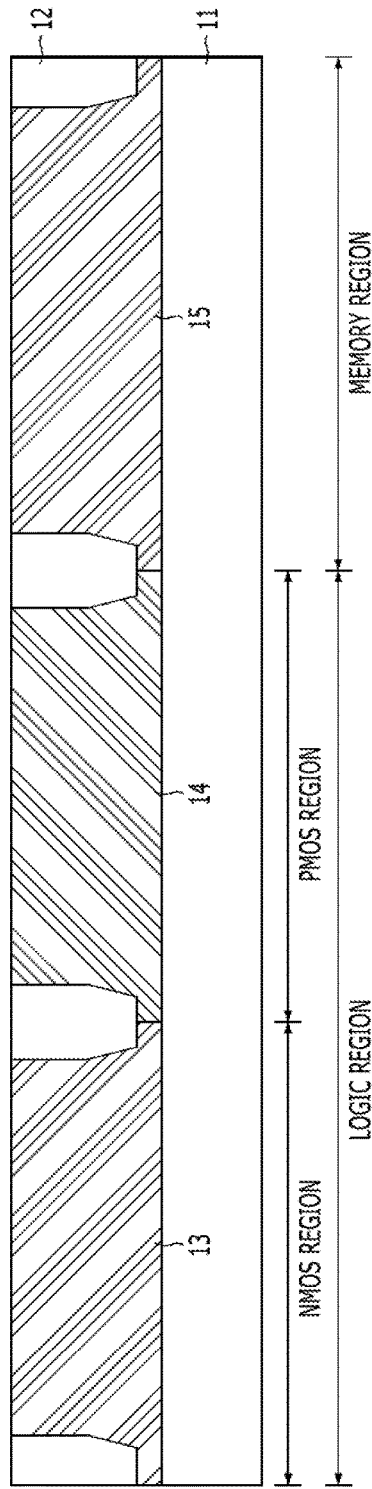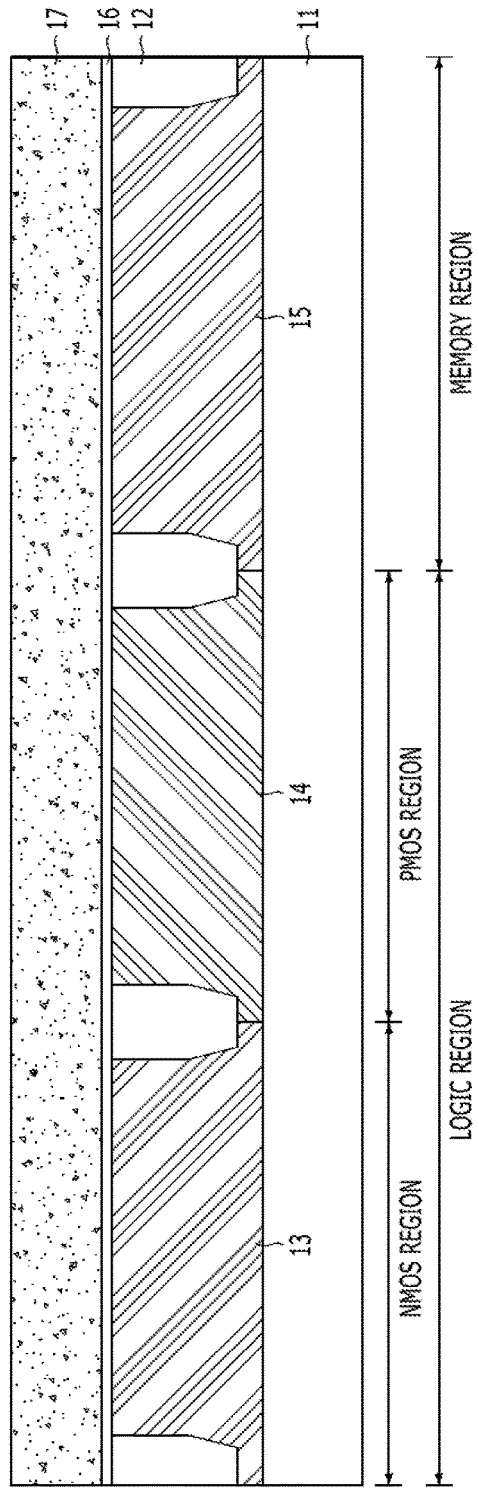

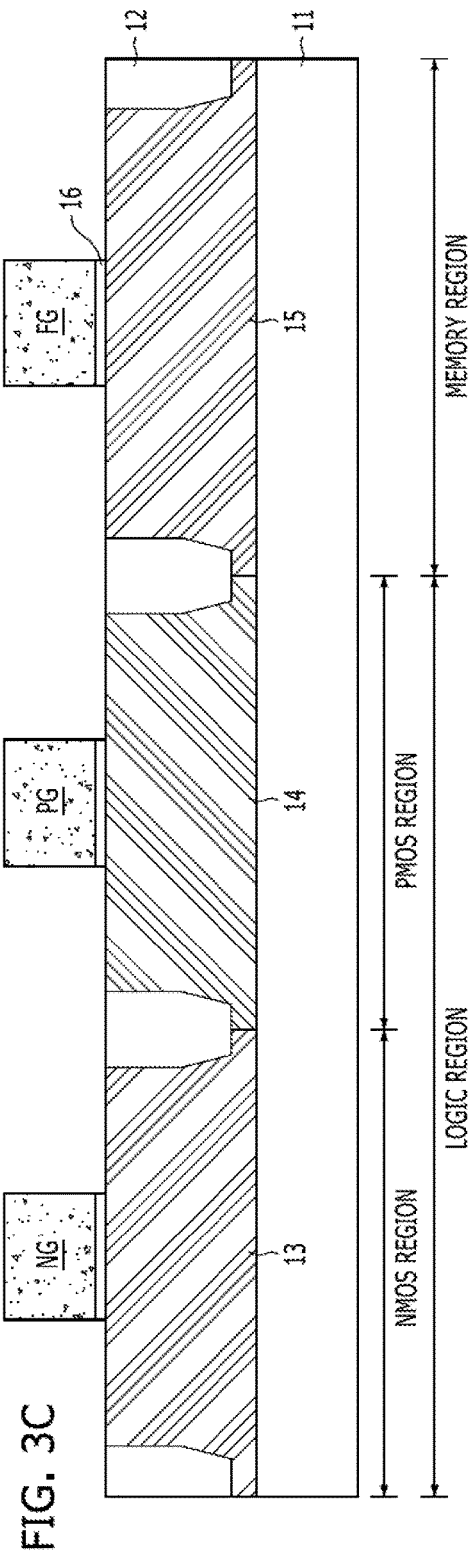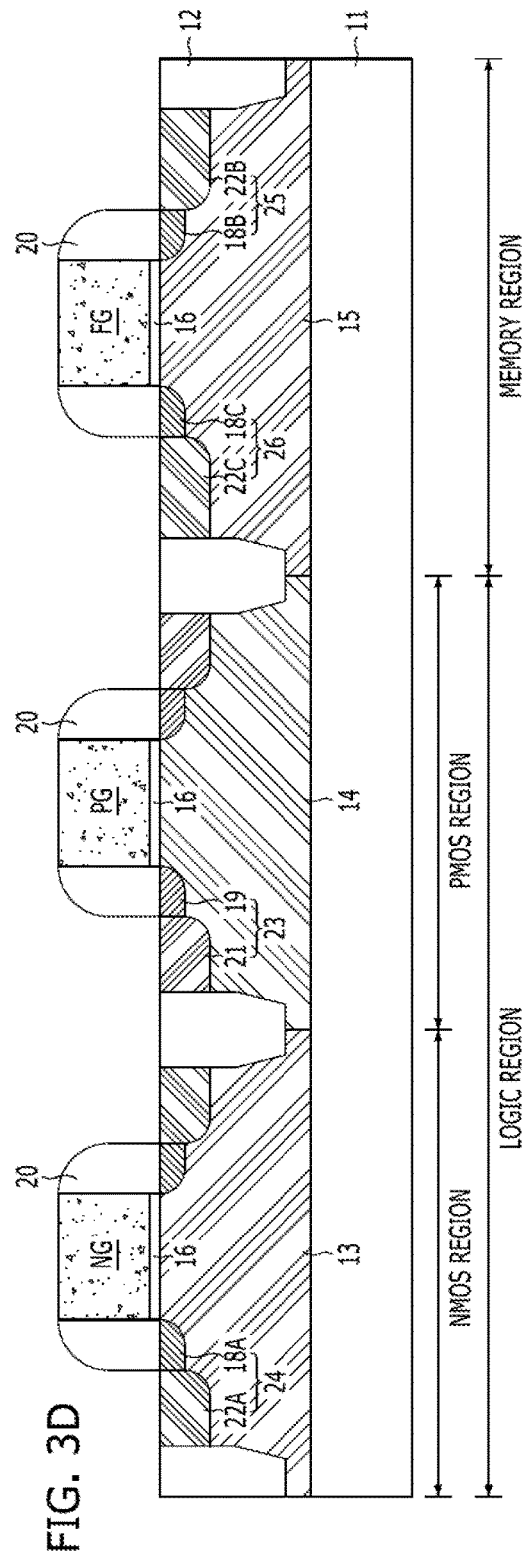

US 9,646,977 B2

NONVOLATILE MEMORY DEVICE AND METHOD FOR FABRICATING THE SAME

CROSS-REFERENCE TO RELATED APPLICATIONS

The present application is a continuation of U.S. patent application Ser. No. 13/873,681 filed on Apr. 30, 2013, which claims priority to Korean Patent Application No. 10-2012-00151093, filed on Dec. 21, 2012, which are incorporated herein by reference in their entireties.

BACKGROUND

1. Field

Embodiments of the present invention relate to a semiconductor device fabrication technology, and more particularly, to a nonvolatile memory device and a method for fabricating the same.

2. Description of the Related Art

A life environment is being changed such that anyone can conveniently use desired information anytime and anywhere, thanks to recently developed digital media devices. As a conversion is made from analog to digital, a variety of rapidly spreading digital devices require storage media capable of conveniently storing captured images, recorded music and various data. In order to meet this requirement, there is a growing interest in the field of a system-on-chip (SoC) according to a tendency for a high degree of integration of non-memory semiconductors, and semiconductor manufacturers compete to invest in the SoC field in an effort to strengthen SoC-based technology. In an SoC, multiple system technologies are integrated in one semiconductor.

In the SoC field where complicated technologies are integrated, a need for an embedded memory to trim an analog device or store an internal operation algorithm is gradually increasing as chips with a composite function in which a digital circuit and an analog circuit are mixed become more common. In particular, an embedded memory of interest is a flash electrically erasable programmable read-only memory (EEPROM). This is because the flash EEPROM is a highly integrated nonvolatile memory device which can store data even in a power-off state like a ROM and is capable of electrically erasing and programming data. EEPROMs include a single gate EEPROM which has one gate (for example, a floating gate), a stack gate (ETOX) EEPROM in which two gates (for example, a floating gate and a control gate) are vertically stacked, a dual gate EEPROM, and a split gate EEPROM.

Because the characteristics of an analog device can be affected by variation corresponding to the number of processes used to create the device, an embedded memory to be applied to a system-on-chip including an analog device should be fabricated using a CMOS process or a logic process while minimizing additional processes so that process variation is minimized.

However, in the conventional art, since the stack gate EEPROM, the dual gate EEPROM and the split gate EEPROM need additional processes to create additional structures, limitations exist in applying the stack gate EEPROM, the dual gate EEPROM and the split gate EEPROM to an embedded memory. Conversely, while the single gate EEPROM may be formed with fewer process steps, since a floating gate is coupled using a well which is formed in a substrate, the degree of integration of a single gate EEPROM is limited.

Accordingly, there is a need for a nonvolatile memory device capable of being fabricated in conformity with a logic process similar to a single gate EEPROM without increasing the degree of integration.

SUMMARY

Various embodiments are directed to a nonvolatile memory device which uses few processing steps, and a method for fabricating the same.

Also, various embodiments are directed to a nonvolatile memory device which can improve the degree of integration, and a method for fabricating the same.

In an embodiment, a nonvolatile memory device includes a floating gate formed over a substrate; a contact plug formed on a first side of the floating gate and disposed parallel to the floating gate with a gap defined therebetween; and a spacer formed on a sidewall of the floating gate and filling the gap, and the contact plug and the floating gate may have a sufficiently large overlapping area to enable the contact plug to operate as a control gate for the floating gate.

In an embodiment, a nonvolatile memory device includes a floating gate formed over a substrate; a spacer formed on a sidewall of the floating gate; a first contact plug formed on a first side of the floating gate and contacting the spacer, the first contact plug being spaced apart from the floating gate by a first distance; and a second contact plug formed on a second side of the floating gate opposite to the first side, the second contact plug being spaced apart from the floating gate by a second distance, and the first distance may be less than the second distance, and the first contact plug and the floating gate may have a sufficiently large overlapping area and the first distance is sufficiently small to enable the first contact plug to operate as a control gate for the floating gate.

In an embodiment, a nonvolatile memory device includes a select gate formed over a substrate; a floating gate formed over the substrate and adjoining the select gate; a spacer formed on sidewalls of the floating gate and the select gate; and a contact plug contacting a portion of the spacer adjacent to the floating gate.

In an embodiment, a method for fabricating a nonvolatile memory device includes forming a floating gate over a substrate; forming a spacer on a sidewall of the floating gate; forming an interlayer dielectric layer over an upper surface of the substrate; and forming a first contact plug and a second contact plug on first and second sides of the floating gate through the interlayer dielectric layer, and the first contact plug is formed to contact the spacer. The first contact plug is formed to have a sidewall which faces a sidewall of the floating gate. The first contact plug and the second contact plug are formed to have different shapes. The first contact plug is a bar type, and the second contact plug is a hole type. A distance between the floating gate and the second contact plug is larger than a distance between the floating gate and the first contact plug. A first facing area through which sidewalls of the floating gate and the first contact plug face each other is defined to be larger than a second facing area through which sidewalls of the floating gate and the second contact plug face each other.

In an embodiment, a method for fabricating a nonvolatile memory device includes forming a gate conductive layer over a substrate which has a logic region and a memory region; selectively etching the gate conductive layer and forming a gate in the logic region and a floating gate in the memory region; forming spacers on sidewalls of the gate and the floating gate; forming an interlayer dielectric layer over an upper surface of the substrate; and forming a first contact plug and a second contact plug which pass through the interlayer dielectric layer on first and second sides of the floating gate, and the first contact plug is formed to contact the spacer. The first contact plug is formed to have a sidewall which faces a sidewall of the floating gate. The first contact plug and the second contact plug are formed to have different shapes. The first contact plug is a bar type, and the second contact plug is a hole type. A distance between the floating gate and the second contact plug is larger than a distance between the floating gate and the first contact plug. A first facing area through which sidewalls of the floating gate and the first contact plug face each other is larger than a second facing area through which sidewalls of the floating gate and the second contact plug face each other.

In an embodiment, a nonvolatile memory device includes a substrate having a plurality of active regions; floating gates formed over the respective active regions; spacers formed on sidewalls of the floating gates; first contact plugs formed on first sides of the floating gates and contacting the spacers; second contact plugs formed on second opposing sides of the floating gates; first conductive lines each contacting a plurality of first contact plugs which are arranged in a first direction; and second conductive lines each contacting a plurality of second contact plugs which are arranged in a second direction crossing the first conductive lines. The nonvolatile memory device further includes a first interlayer dielectric layer formed over an upper surface of the substrate; and a second interlayer dielectric layer formed over the first interlayer dielectric layer, and the first contact plugs contact the first conductive lines over the second interlayer dielectric layer by passing through the first and second interlayer dielectric layers, and the second contact plugs contact the second conductive lines over the first interlayer dielectric layer by passing through the first interlayer dielectric layer. The first contact plugs have sidewalls which face sidewalls of the floating gates. The first contact plugs and the second contact plugs have different shapes. The first contact plugs are bar types, and the second contact plugs are hole types. A distance between the floating gates and the second contact plugs is larger than a distance between the floating gates and the first contact plugs. A first facing area through which sidewalls of the floating gates and the first contact plugs face each other is larger than a second facing area through which sidewalls of the floating gates and the second contact plugs face each other. The floating gates are coupled in response to a voltage applied to the first contact plugs. A coupling ratio between the floating gates and the first contact plugs increases as the distance between the first contact plugs and the floating gates decreases.

In an embodiment, a nonvolatile memory device includes a substrate having a plurality of active regions; floating gates formed over the respective active regions; contact plugs formed on first sides of the floating gates and disposed parallel to the floating gates with gaps defined therebetween; spacers formed on sidewalls of the floating gates and filling the gaps; first conductive lines each contacting a plurality of contact plugs which are arranged in a first direction; and second conductive lines each connecting a plurality of active regions which are arranged in a second direction crossing the first conducive lines. The nonvolatile memory device further includes an interlayer dielectric layer formed over an upper surface of the substrate; and the contact plugs are coupled to the first conductive lines over the interlayer dielectric layer by passing through the interlayer dielectric layer. The nonvolatile memory device further includes junction regions formed in the active regions on the first and sides of the floating gates and second opposing sides of the floating gates, and the second conductive lines comprise connection parts which connect junction regions which are formed on the second sides of the floating gates. The connection parts comprise impurity regions which are formed in the substrate. The contact plugs have sidewalls which face sidewalls of the floating gates. The floating gates are coupled in response to a voltage applied to the contact plugs. A coupling ratio between the floating gates and the contact plugs increases as a width of the gaps decreases.

In an embodiment, a nonvolatile memory device includes a select gate formed over a substrate; a floating gate formed over the substrate and adjoining the select gate; a spacer formed on sidewalls of the floating gate and the select gate and filling a gap between the select gate and the floating gate; and a contact plug contacting a portion of the spacer adjacent to the floating gate. The contact plug has a sidewall which faces a sidewall of the floating gate. The floating gate has a sidewall which faces a sidewall of the select gate. The floating gate is coupled in response to a first voltage applied to the contact plug, and the floating gate is also coupled in response to a second voltage applied to the select gate.

BRIEF DESCRIPTION OF THE DRAWINGS

FIGS. 3A to 3E are cross-sectional views illustrating a method for fabricating a unit cell of a nonvolatile memory device in accordance with an embodiment of the present invention.

DETAILED DESCRIPTION

Figure 1A:
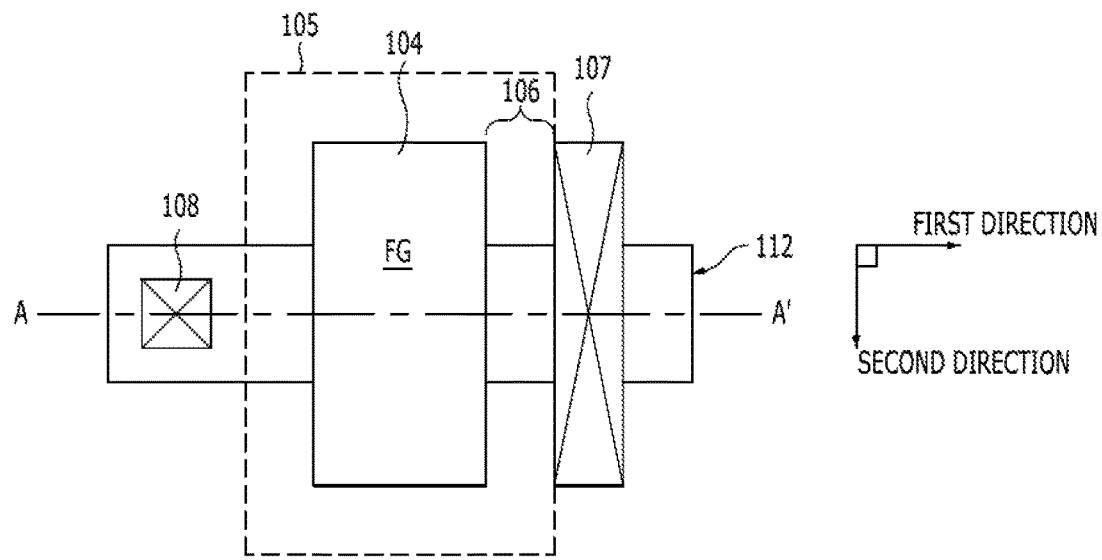
FIGS. 1A and 1B are views illustrating a unit cell of a nonvolatile memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Embodiments of the present invention which will be described below provide a nonvolatile memory device which is applicable to an embedded memory, and a method for fabricating the same. In particular, embodiments of the present invention provide a nonvolatile memory device which is applicable to an embedded memory in a system-on-chip (SoC) which includes an analog device, and a method for fabricating the same. To this end, embodiments of the present invention provide nonvolatile memory devices which may be fabricated using the same number of process steps as a single gate EEPROM while achieving a higher degree of integration, and a method for fabricating the same.

For reference, in a conventional single gate EEPROM, because an impurity region such as a well which is formed in a substrate is used to couple a floating gate, a fabrication process requires relatively few process steps. However, in the single gate EEPROM, limitations exist in increasing the degree of integration. In a stack gate EEPROM in which a floating gate and a control gate are vertically stacked, a dual gate EEPROM in which a control gate and a floating gate are disposed side by side, and a split gate EEPROM in which a control gate covers one side of a floating gate, since a control gate for coupling a floating gate is provided, the degree of integration may be increased. However, since the floating gate and the control gate cannot be simultaneously formed, separate additional processes are needed to form the control gates.

In consideration of the limitations of conventional devices, embodiments of the present invention which will be described below provide a nonvolatile memory device which has a floating gate and a contact plug serving as a control gate for coupling the floating gate, thereby increasing the degree of integration without needing separate additional processes for forming a control gate, and a method for fabricating the same.

Meanwhile, in the following descriptions, a first conductivity type and a second conductivity type refer to complementary conductivity types. Namely, if the first conductivity type is a P type, the second conductivity type is an N type, and, if the first conductivity type is an N type, the second conductivity type is a P type. Thus, a nonvolatile memory device in accordance with embodiments of the present invention may be an N-channel type or a P-channel type. Hereinafter, for the sake of convenience in explanation, the first conductivity type will be described as a P type and the second conductivity type will be described as an N type. That is to say, descriptions will be made below based on embodiments which are N-channel type nonvolatile memory devices.

Figure 1B:
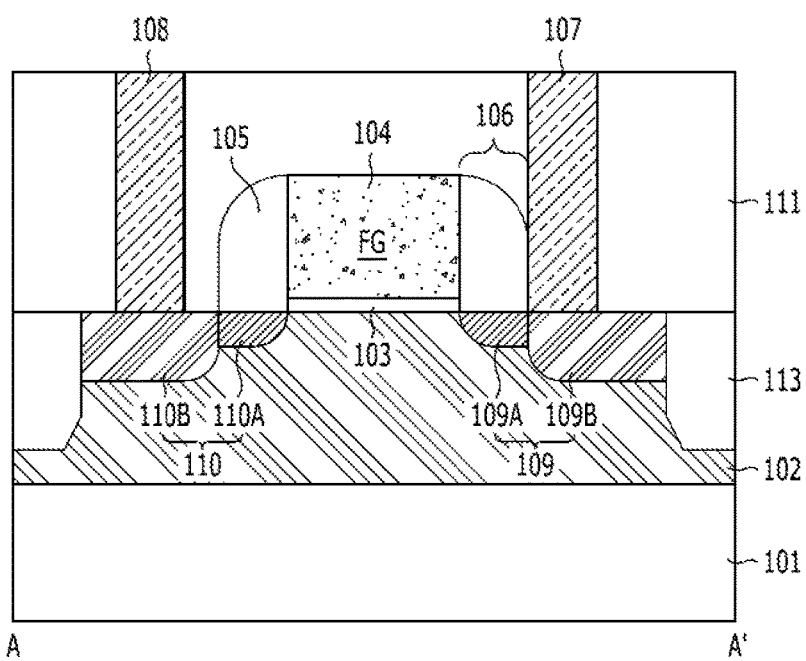

FIGS. 1A and 1B are views illustrating a unit cell (or memory cell) of a nonvolatile memory device in accordance with an embodiment of the present invention. In detail, FIG. 1A is a plan view, and FIG. 1B is a cross-sectional view taken along the lines A-A' of FIG. 1A.

Referring to FIGS. 1A and 1B, a first conductivity type well 102 is formed in a substrate 101. The substrate 101 may be a semiconductor substrate. The semiconductor substrate may be in a single crystalline state, and may include silicon. That is to say, the semiconductor substrate may include monocrystalline silicon. For instance, the substrate 101 may be a bulk silicon substrate, or a silicon-on-insulator (SOI) substrate in which a supporting substrate, a buried dielectric layer and a monocrystalline silicon layer are sequentially stacked. The well 102 provides a base on which a unit cell may operate, and may be formed by ion-implanting impurities of the first conductivity type into the substrate 101.

An isolation structure 113 is formed in the substrate 101 in such a way as to define an active region 112. The isolation structure 113 may be formed through a shallow trench isolation (STI) process, and may include a dielectric layer. The active region 112 which is defined by the isolation structure 113 may be a bar type or a line type which has a major axis extending in a first direction and a minor axis extending in a second direction crossing with (or perpendicular to) the first direction. Junction regions are formed in both end portions of the active region 112 in the first direction. In order to facilitate contact between the junction regions and contact plugs (or conductive lines), the active region 112 may include projections (not shown) which project in the second direction.

A floating gate (FG) 104 is formed on the substrate 101. The floating gate 104 performs a function of storing logic information and may be a bar type. In detail, in the first direction, the floating gate 104 may have a structure which is positioned at the middle portion of the active region 112 which has outer edges overlapping with the active region 112. In the second direction, the floating gate 104 may have a structure which covers the active region 112 and of which both ends overlap with the isolation structure 113. In other words, the length of the floating gate 104 in the second direction may be the same or larger than the width of the active region 112 in the second direction.

The floating gate 104 may include silicon. In an embodiment, the floating gate 104 may be a polysilicon layer. The polysilicon layer may be a doped polysilicon layer doped with impurities or an undoped polysilicon layer not doped with impurities. While the floating gate 104 in the embodiment of FIG. 1B is a planar gate, in another embodiment the floating gate 104 may have a three-dimensional gate structure, such as a fin gate structure.

A gate dielectric layer 103 is formed between the substrate 101 and the floating gate 104, and a spacer 105 is formed on the sidewalls of the floating gate 104. Each of the gate dielectric layer 103 and the spacer 105 may include a dielectric layer. For example, each of the gate dielectric layer 103 and the spacer 105 may include an oxide layer, a nitride layer, an oxynitride layer, or a stack layer thereof.

A first junction region 109 and a second junction region 110 are formed in the substrate 101 on both sides of the floating gate 104. In detail, the first junction region 109 and the second junction region 110 are formed in the active region 112 on opposing sides of the floating gate 104. The first junction region 109 and the second junction region 110 may be impurity regions which are formed by ion-implanting impurities of the second conductivity type into the substrate 101. The first junction region 109 and the second junction region 110 may respectively serve as a drain region and a source region, and may have lightly doped drain (LDD) structures. In detail, the first junction region 109 includes a first impurity region 109A of the second conductivity type and a second impurity region 109B of the second conductivity type. Similarly, the second junction region 110 includes a first impurity region 110A of the second conductivity type and a second impurity region 110B of the second conductivity type. In an embodiment, the impurity doping concentrations of the second impurity regions 109B and 110B are larger than the impurity doping concentrations of the first impurity regions 109A and 110A.

An interlayer dielectric layer 111 is disposed on the surface of the substrate 101 covering the floating gate 104, and a first contact plug 107 and a second contact plug 108 which are respectively connected to the first junction region 109 and the second junction region 110 penetrate the interlayer dielectric layer 111. The interlayer dielectric layer 111 may include an oxide layer, a nitride layer, or an oxynitride layer.

The first contact plug 107 electrically connects a conductive line (not shown) on the interlayer dielectric layer 111 with the first junction region 109, and performs the function of a control gate which couples the floating gate 104 in a program operation, an erase operation and a read operation. The floating gate 104 may be coupled in response to a bias (for example, a voltage) which is applied to the first contact plug 107. To this end, the first contact plug 107 may be disposed parallel and adjacent to the floating gate 104 with a gap 106 defined therebetween, and may contact the spacer 105 formed on the sidewalls of the floating gate 104 and in the gap 106. In an embodiment, the parallel sidewalls of floating gate 104 and first contact plug 107 may run along the long axis of each structure in order to maximize the facing area.

In other words, the first contact plug 107 may have a shape which has a sidewall facing at least one sidewall of the floating gate 104, and the spacer 105 between the floating gate 104 and the first contact plug 107, that is, the spacer 105 formed in the gap 106 serves as a dielectric layer (for example, an Inter-Poly Dielectric (IPD)). In an embodiment, the dielectric layer is a dielectric material which is inserted between the floating gate 104 and a control gate. While a dielectric layer is formed through a separate process in the conventional art, the spacer 105 formed on the sidewalls of the floating gate 104 is used as the dielectric layer in the embodiment of the present invention.

In an embodiment, in order to secure a sufficiently large coupling ratio to program the floating gate 104, the first contact plug 107 may be a bar type which has a sidewall corresponding to an entire sidewall of a bar type floating gate 104. As the area of the sidewalls of the floating gate 104 and the first contact plug 107 which face each other is increased within a range allowable by a design margin, the coupling ratio therebetween may be increased. In an embodiment, the first contact plug 107 has sidewalls facing at least two sidewalls of the floating gate 104. In an embodiment, the first contact plug 107 has sidewalls facing at least three sidewalls of the floating gate 104.

The gap 106 is defined between the sidewalls of the first contact plug 107 facing that of the floating gate 104, and the width of the gap 106 may be constant in the first direction along the second direction. That is to say, the gap 106 maintains a constant width between the floating gate 104 and the first contact plug 107. The width of the gap 106 may be the same or smaller than the width of the spacer 105. In detail, in an embodiment in which the width of the gap 106 is the same as the width of the spacer 105, the first contact plug 107 may have a shape which contacts the sidewall of the spacer 105, and, in an embodiment in which the width of the gap 106 is smaller than the width of the spacer 105, the first contact plug 107 may have a shape which partially covers the spacer 105.

Meanwhile, in an embodiment where a corresponding area between the floating gate 104 and the first contact plug 107, that is, a facing area (or an overlapping area) of the floating gate 104 and the first contact plug 107, is large so a relatively high coupling ratio is secured, the width of the gap 106 may be larger than the width of the spacer 105. In other words, the coupling ratio is a function of both the amount of overlapping area and the width of the gap, so an embodiment with a large overlapping area can use a wider gap, while an embodiment with a narrow gap can use a smaller facing area, to secure the same coupling ratio. Embodiments of the present invention may vary according to these principles.

The second contact plug 108 connects a conductive line (not shown) with the second junction region 110, and a bias (for example, a voltage) applied to the second contact plug 108 does not exert any influence on the floating gate 104. In other words, the floating gate 104 is not coupled in response to bias of the second contact plug 108. To this end, an area of the sidewall of the second contact plug 108 which faces the sidewall of the floating gate 104 may be smaller than the overlapping area of sidewalls of the first contact plug 107 and the floating gate 104. For instance, the second contact plug 108 may be a hole type. Further, the gap between the second contact plug 108 and the floating gate 104 may be larger than the gap between the floating gate 104 and the first contact plug 107. For instance, the second contact plug 108 may not contact the spacer 105 and may be separated from the spacer 105 by a predetermined distance.

Since the nonvolatile memory device with the above-described structure has the floating gate 104 and the first contact plug 107 serving as a control gate for coupling the floating gate 104, the degree of integration and operation characteristics of the nonvolatile memory device may be improved compared to a single gate EEPROM.

Also, in a nonvolatile memory device with the above-described structure, because the coupling ratio between the floating gate 104 and the first contact plug 107 increases as the width of the gap 106 between the floating gate 104 and the first contact plug 107 decreases, the design rule may be decreased and the degree of integration and operation characteristics of the nonvolatile memory device may be further improved as the degree of integration of the nonvolatile memory device increases. That is to say, as the design rule of a logic process for fabricating the nonvolatile memory device decreases, the coupling ratio increases as the gap between the floating gate 104 and the first contact plug 107 decreases, and the degree of integration and operation characteristics of a nonvolatile memory device may be further improved.

In addition, in a nonvolatile memory device with the above-described structure, because the first contact plug 107 is used as a control gate and the spacer 105 between the first contact plug 107 and the floating gate 104 serves as a dielectric layer, it is possible to fabricate a nonvolatile memory device which does not require separate processes for forming a control gate. This will be described later in detail in conjunction with a method for fabricating a nonvolatile memory device in accordance with an embodiment of the present invention.

Figure 2A:
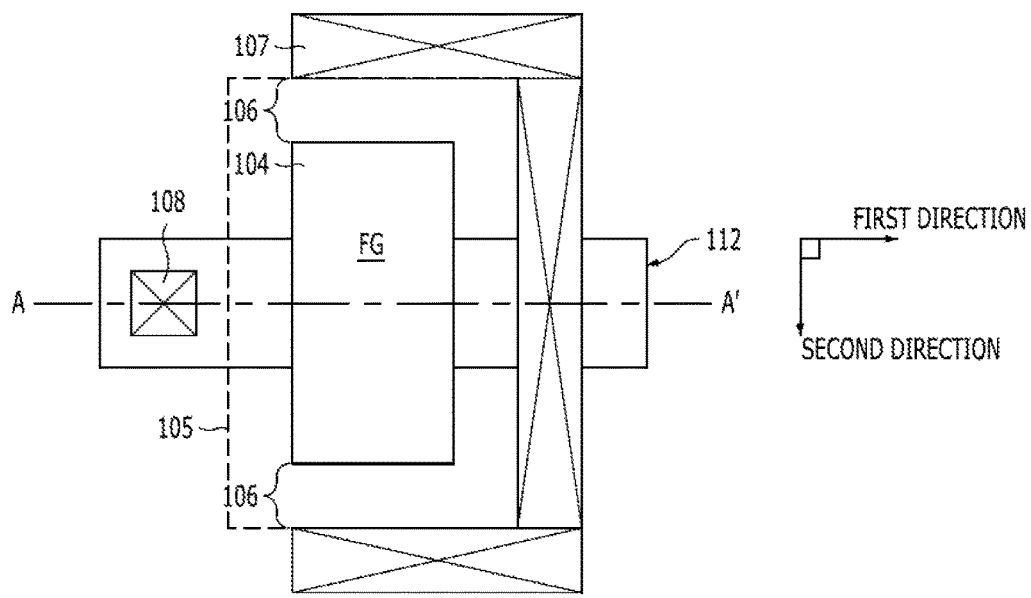
FIGS. 2A and 2B are plan views illustrating variations of a unit cell of the nonvolatile memory device in accordance with embodiments of the present invention.
Figure 2B:
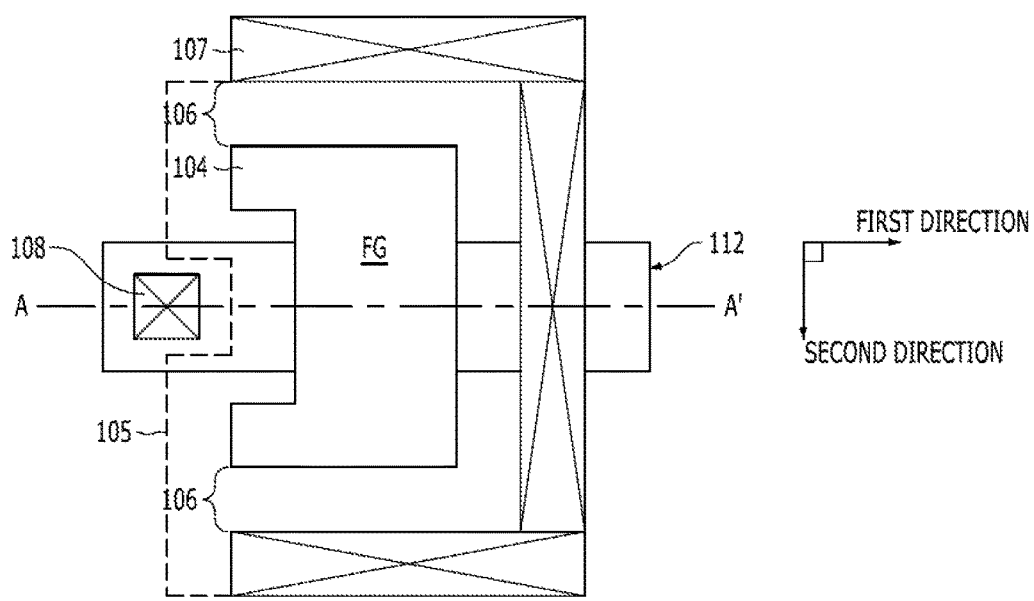

FIGS. 2A and 2B are plan views illustrating nonvolatile memory devices in accordance with embodiments of the present invention. For illustrative convenience, the same reference numerals as those of FIGS. 1A and 1B will be used in FIGS. 2A and 2B. Since cross-sectional views taken along the line A-A' of FIGS. 2A and 2B show features similar to the cross-sectional view taken along the line A-A' of FIG. 1A, reference will be made to FIG. 1B.

Referring to FIG. 2A, in order to increase the coupling ratio between the floating gate 104 and the first contact plug 107, the first contact plug 107 may have a shape which has sidewalls facing (or overlapping) all the sidewalls of the floating gate 104 except for the sidewall of the floating gate 104 facing the second contact plug 108. In detail, the floating gate 104 may be a bar type, and the first contact plug 107 may have a shape which has sidewalls facing one sidewall of the floating gate 104 in the first direction and facing two sidewalls of the floating gate 104 in the second direction. The width of the gap 106 may be constant in the first direction and in the second direction.

Alternatively, the first contact plug 107 may have a shape which has sidewalls facing one sidewall of the floating gate 104 in the first direction and facing only one sidewall of the floating gate 104 in the second direction. In other words, an embodiment may include one set of facing sidewalls in the first direction, and at least one set of facing sidewalls in the second direction.

Referring to FIG. 2B, in order to further increase the coupling ratio between the floating gate 104 and the first contact plug 107, the floating gate 104 may have a shape in which opposing end portions project, and the first contact plug 107 may have a shape which has sidewalls facing all the respective remaining sidewalls, including projected sidewalls of the floating gate 104, but not the sidewall of the floating gate 104 facing the second contact plug 108. In other words, in an embodiment, the floating gate 104 may include at least one projected portion which projects from the sidewall facing second contact plug 108 in the direction of contact plug 108. In an embodiment which includes two projecting portions, the floating gate may have a "C" shape, or a "[" shape, with an opening facing the second contact plug 108. Accordingly, the first contact plug 107 may have a "C" shape, or a "[" shape having an opening facing the second contact plug 108 in an embodiment. The size of the opening may vary according to implementation.

In an embodiment, the floating gate 104 may have a shape in which only one of the end portions projects, and the first contact plug 107 may have a shape which has sidewalls facing all the respective sidewalls including the projected sidewall of the floating gate 104, but not the sidewall of the floating gate 104 facing the second contact plug 108.

As described above, by adjusting the shapes of the floating gate 104 and the first contact plug 107, the coupling ratio between the floating gate 104 and the first contact plug 107 may be increased, and as a result, the degree of integration and the operation characteristics of the nonvolatile memory device may be improved.

A method for forming a nonvolatile memory device according to an embodiment is described below with reference to FIGS. 3A to 3E.

FIGS. 3A to 3E are cross-sectional views illustrating a method for fabricating a unit cell of a nonvolatile memory device in accordance with an embodiment of the present invention. In these drawings, the cross-sectional views correspond to line A-A' of FIG. 1A.

Referring to FIG. 3A, a substrate 11 having a logic region and a memory region is provided. The logic region may include an NMOS region and a PMOS region. The substrate 11 may be a semiconductor substrate. The semiconductor substrate may be in a single crystalline state, and may include silicon. In other words, the semiconductor substrate may include monocrystalline silicon. For example, a bulk silicon substrate or a silicon-on-insulator (SOI) substrate may be used as the substrate 11.

A first well 13, a second well 14 and a third well 15 are formed in the substrate 11 corresponding to the NMOS region, the PMOS region, and the memory region, respectively. The first well 13 may be formed by ion-implanting impurities of the first conductivity type (in an embodiment, P type impurities) into the substrate 11, and the second well 14 may be formed by ion-implanting impurities of the second conductivity type (in an embodiment, N type impurities) into the substrate 11. The third well 15 corresponding to the memory region may have a conductivity type according to a channel type of a unit cell. For instance, in an embodiment in which the unit cell is an N-channel type, the third well 15 may be formed by ion-implanting impurities of the first conductivity type (that is, P type impurities) into the substrate 11. The first well 13, the second well 14 and the third well 15 may contact each other, and since their respective conductivity types are different from each other, junction isolation regions are formed between them.

An isolation structure 12 is formed in the substrate 11, thereby defining active regions in the respective regions. The depth of the isolation structure 12 may be less than the depth of each of the first well 13, the second well 14, and the third well 15. The isolation structure 12 may be formed through a shallow trench isolation (STI) process. The STI process encompasses a series of processes used to form the isolation structure 12 by defining trenches for isolation in the substrate 11 and filling a dielectric substance in the trenches. Meanwhile, in some embodiments, the first well 13, the second well 14, and the third well 15 may be formed after forming the isolation structure 12.

Referring to FIG. 3B, a gate dielectric layer 16 may be formed over the entire surface of the substrate 11. The gate dielectric layer 16 may be formed as an oxide layer, a nitride layer, an oxynitride layer, or a stack layer thereof. In another embodiment, the gate dielectric layer 16 may be formed only on portions of the substrate 11 on which the isolation structure 12 is not formed.

A gate conductive layer 17 is formed on the gate dielectric layer 16. The gate conductive layer 17 may include silicon. For instance, the gate conductive layer 17 may be formed as a polysilicon layer.

Impurities are ion-implanted into portions of the gate conductive layer 17 which correspond to the NMOS region, the PMOS region, and the memory region, respectively. This is to provide characteristics (for example, work functions) of the gate conductive layer 17 which are particular to the respective regions. For example, impurities of the first conductivity type may be ion-implanted into a portion of the gate conductive layer 17 corresponding to the PMOS region, and impurities of the second conductivity type may be ion-implanted into the gate conductive layer 17 corresponding to the NMOS region. Impurities may not be ion-implanted into a portion of the gate conductive layer 17 corresponding to the memory region, or predetermined impurities may be ion-implanted according to a channel type of the memory. For instance, impurities of the second conductivity type may be ion-implanted into a portion of the gate conductive layer 17 corresponding to the memory region.

Referring to FIG. 3C, after forming mask patterns (not shown) on the gate conductive layer 17, a plurality of gates NG, PG and FG are formed by sequentially etching the gate conductive layer 17 and the gate dielectric layer 16 using the mask patterns as an etch barrier. In detail, a first gate NG and a second gate PG are respectively formed in the NMOS region and the PMOS region, and a floating gate FG is formed in the memory region. All of the first gate NG, the second gate PG, and the floating gate FG are simultaneously formed through the same etching process in an embodiment.

Referring to FIG. 3D, by ion-implanting impurities of the first conductivity type into portions of the substrate 11 on both sides of the second gate PG, first impurity regions 19 are formed. Then, by ion-implanting impurities of the second conductivity type into portions of the substrate 11 on both sides of the first gate NG and the floating gate FG, second impurity regions 18A, 18B and 18C of the second conductivity type are formed.

Spacers 20 are formed on the sidewalls of the first gate NG, the second gate PG and the floating gate FG. The spacers 20 may be formed as a dielectric layer. The dielectric layer may be an oxide layer, a nitride layer, an oxynitride layer, or a stack layer thereof. The spacers 20 may be formed through a series of processes including depositing a dielectric layer on the surface of the structure including the first gate NG, the second gate PG and the floating gate FG and then performing blanket etching, for example, an etch-back process.

By ion-implanting impurities of the first conductivity type into the substrate 11 on both sides of the second gate PG including the spacers 20, third impurity regions 21 are formed. Fourth impurity regions 22A, 22B and 22C are formed in the substrate 11 on both sides of the first gate NG including the spacers 20 and in the substrate 11 on both sides of the floating gate FG including the spacers 20. The third impurity regions 21 may be formed to have an impurity doping concentration larger than the first impurity regions 19, and the fourth impurity regions 22A, 22B and 22C may be formed to have impurity doping concentrations larger than the concentrations of second impurity regions 18A, 18B and 18C.

Through the above-described processes, source/drain regions 24 of the second conductivity type with LDD structures which include the second impurity region 18A and the fourth impurity region 22A may be formed in the NMOS region. Source/drain regions 23 of the first conductivity type with LDD structures which include the first impurity region 19 and the third impurity region 21 may be formed in the PMOS region. A first junction region 25 and a second junction region 26 with LDD structures which include the second impurity regions 18B and 18C and the fourth impurity regions 22B and 22C may be formed in the memory region.

While not shown in a drawing, a metal silicide (not shown) may be formed on the upper surfaces of the plurality of gates NG, PG and FG, the surfaces of the source/drain regions 24 of the NMOS region, the surfaces of the source/drain regions 23 of the PMOS region, and the surfaces of the first junction region 25 and the second junction region 26 of the memory region. The metal silicide performs the function of reducing resistance and improving signal transfer characteristics. The metal silicide may be formed through a series of processes of forming a metal layer on the entire surface of the structure including the plurality of gates NG, PG and FG, perform annealing to form the metal silicide and removing remaining portions of the metal layer after the anneal.

Figure 3E:
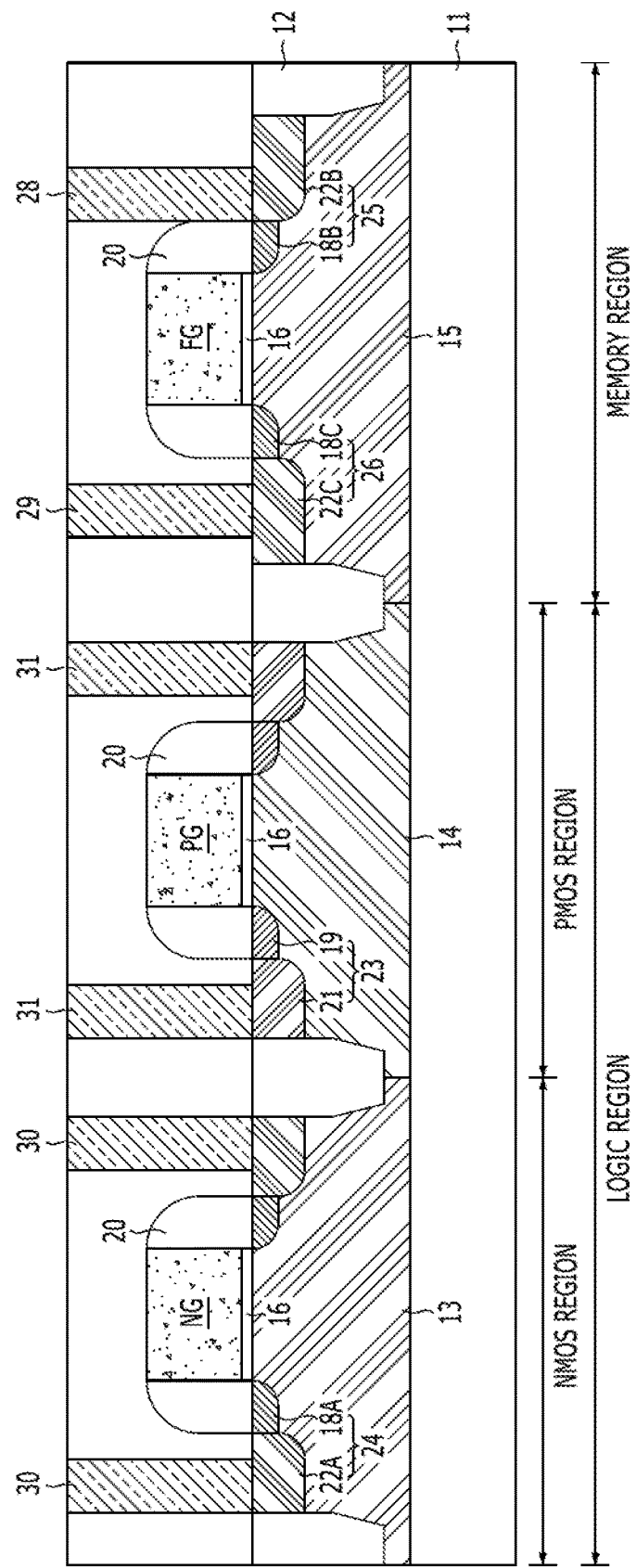

Referring to FIG. 3E, an interlayer dielectric layer 27 is formed on the entire surface of the substrate 11 to cover the first gate NG, the second gate PG and the floating gate FG. The interlayer dielectric layer 27 may be formed of an oxide layer, a nitride layer, or an oxynitride layer.

A plurality of contact plugs 28, 29, 30 and 31 are formed through the interlayer dielectric layer 27 to respectively contact the first junction region 25 and the second junction region 26 of the memory region, the source/drain regions 24 of the NMOS region, and the source/drain regions 23 of the PMOS region. In detail, a first contact plug 28 contacting the first junction region 25 of the memory region, a second contact plug 29 contacting the second junction region 26 of the memory region, third contact plugs 30 contacting the source/drain regions 24 of the NMOS region, and fourth contact plugs 31 contacting the source/drain regions 23 of the PMOS region may be simultaneously formed. The first contact plug 28 to the fourth contact plugs 31 may be simultaneously formed through a series of processes of defining contact holes by selectively etching the interlayer dielectric layer 27 and filling a conductive substance in the contact holes. In another embodiment, the first contact plug 28 to the fourth contact plugs 31 may be formed independently of one another.

The first contact plug 28 to the fourth contact plugs 31 are connected with conductive lines which are formed on the interlayer dielectric layer 27 and perform the functions of transferring electric signals. The first contact plug 28 not only performs the function of transferring an electric signal, but also serves as a control gate for coupling the floating gate FG. Meanwhile, since the shapes and layout of the floating gate FG, the first junction region 25, the second junction region 26, the first contact plug 28 and the second contact plug 29 in the memory region were described above in detail with reference to FIGS. 1A, 1B, 2A and 2B, detailed descriptions thereof will not be repeated.

While not shown in a drawing, conductive lines may be formed on the interlayer dielectric layer 27 in such a way as to selectively contact the plurality of contact plugs 28, 29, 30 and 31.

As can be seen from the above descriptions, in a method for fabricating the nonvolatile memory device in accordance with an embodiment of the present invention, it is possible to fabricate a nonvolatile memory device which has a floating gate FG and a first contact plug 28 serving as the control gate, without a separate additional processes for forming a control gate.

Moreover, in a method for fabricating the nonvolatile memory device in accordance with an embodiment of the present invention, since the first contact plug 28 is used as the control gate for the floating gate FG and the spacer 20 is used as the dielectric layer, processes may be simplified in comparison with a conventional EEPROM and the number of process steps may be decreased, so that productivity and yield may be increased.

Hereinbelow, operation methods of a unit cell of a nonvolatile memory device in accordance with an embodiment of the present invention will be described with reference to Table 1 and FIGS. 4A to 4C. For the sake of convenience in explanation, the same reference numerals as those of FIG. 1B will be used in FIGS. 4A to 4C.

Figure 4A:
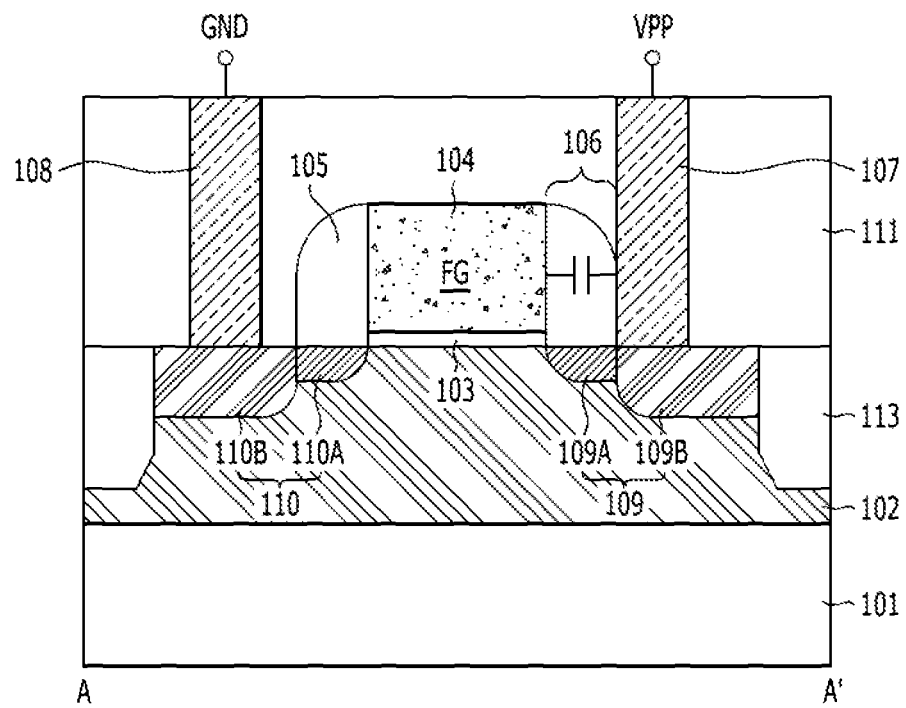
FIGS. 4A to 4C are views illustrating operations of a unit cell of a nonvolatile memory device in accordance with an embodiment of the present invention.
Figure 4B:
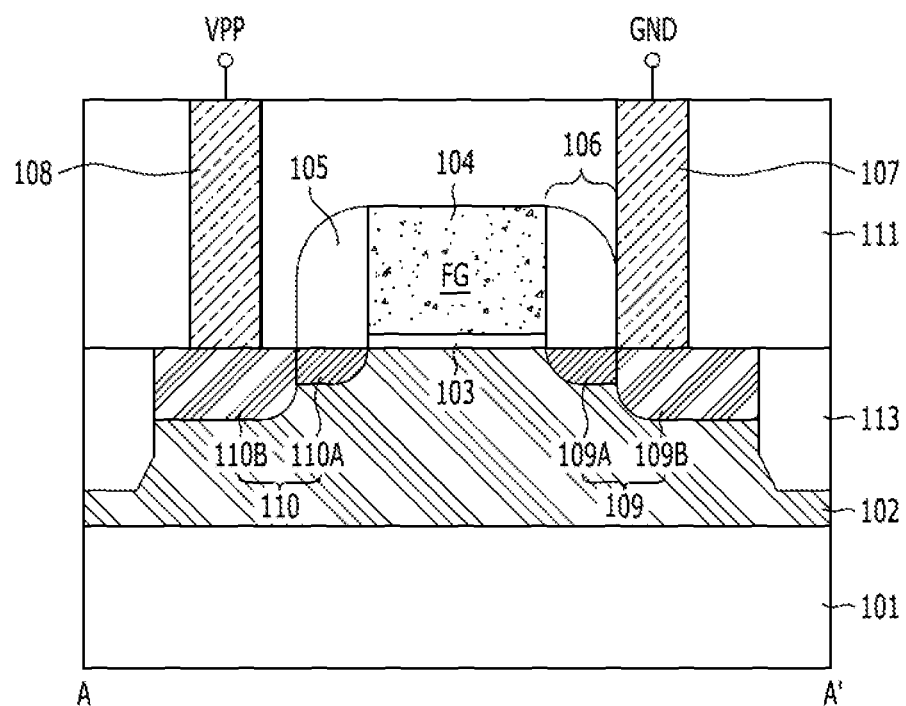
Figure 4C:
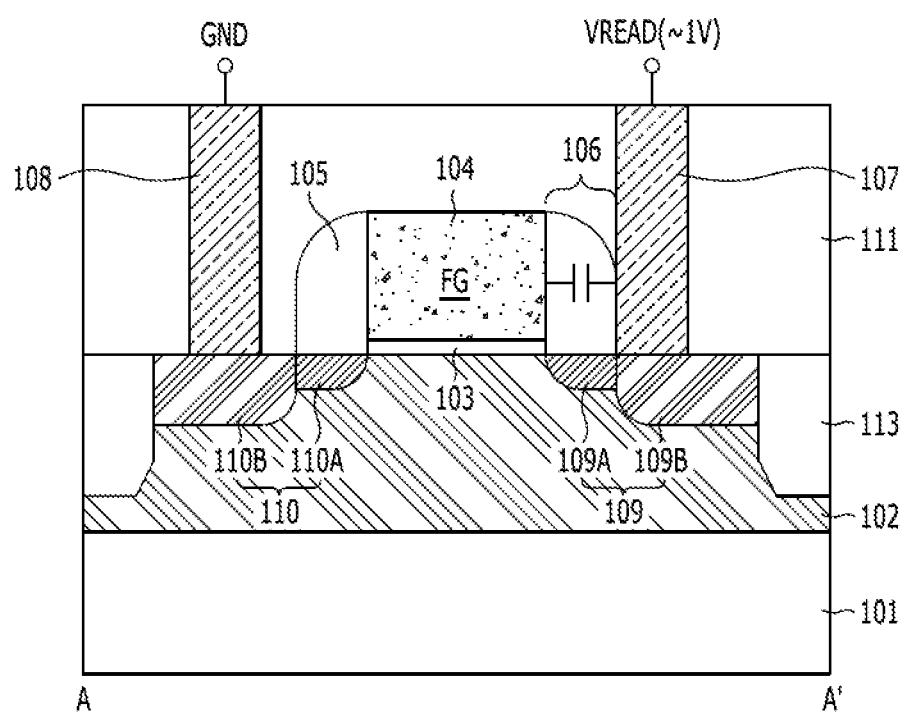

FIGS. 4A to 4C are views illustrating operations of a unit cell (or a memory cell) of the nonvolatile memory device in accordance with an embodiment of the present invention. In detail, FIG. 4A is a cross-sectional view illustrating a program operation, FIG. 4B is a cross-sectional view illustrating an erase operation, and FIG. 4C is a cross-sectional view illustrating a read operation. Table 1 shows operating conditions of the unit cell of a nonvolatile memory device in accordance with an embodiment of the present invention.

TABLE 1

| Operation | | Scheme | First contact plug | Second contact plug | Substrate (or well) | Coupling gate |
|---|---|---|---|---|---|---|
| Program | | HCI | VPP | GND | GND | Coupling |
| Erase | Programmed Cell | Occurrence of BTBT | GND | VPP | GND | Non-coupling |
| | Non-programmed Cell | Non-occurrence of BTBT | GND | VPP | GND | Non-coupling |
| Read | | — | VREAD(~1 V) | GND | GND | Coupling |

A program operation of a unit cell of the nonvolatile memory device in accordance with an embodiment of the present invention will be described below with reference to Table 1 and FIG. 4A.

A program operation may use hot carrier injection (HCI). In detail, as a program voltage and a ground voltage GND are respectively applied to the first contact plug 107 and the second contact plug 108, charges (for example, electrons) are injected into the floating gate 104. The electrons injected into the floating gate 104 increase the threshold voltage of the memory cell with the floating gate 104. The program voltage may be a positive voltage. For instance, the program voltage may be a pumping voltage VPP. The pumping voltage VPP is a voltage which is generated by boosting a power supply voltage VCC supplied from an external source.

Describing the program operation in detail, a channel is formed in a portion of the active region 112, underlying the floating gate 104 to which the first contact plug 107 is capacitively coupled. The first contact plug 107 receives the pumping voltage VPP, and a pinch-off occurs in the channel underlying the floating gate 104. Hot electrons which are generated or flowing in a region where the pinch-off occurs are injected into the floating gate 104. As the hot electrons are injected into the floating gate 104, the threshold voltage of the memory cell with the floating gate 104 is increased, thereby programming the memory cell. This program operation provides an advantage in that program may be easily performed even though the coupling ratio between the floating gate 104 and the first contact plug 107 is small, when compared to Fowler-Nordheim (FN) tunneling.

An erase operation of the unit cell of the nonvolatile memory device in accordance with the embodiment of the present invention will be described below with reference to Table 1 and FIG. 4B.

An erase operation may use band to band tunneling (BTBT). In detail, as the ground voltage GND and an erase voltage are respectively applied to the first contact plug 107 and the second contact plug 108, charges (for example, holes) are injected into the floating gate 104. Electrons are ejected from the floating gate 104 and injected into a conductive region (e.g., the second conductive region 110), and thus, the unit cell may be erased in such a way as to decrease the threshold voltage of the memory cell with the floating gate 104. The erase voltage may be a positive voltage. For instance, the erase voltage may be the pumping voltage VPP.

Describing the erase operation in detail, the erase operation may be divided into an erase operation of a programmed cell and an erase operation of a non-programmed cell.

In the erase operation in the programmed cell, the floating gate 104 is not coupled during the erase operation by the first contact plug 107 applied with the ground voltage GND. However, due to a potential difference between the second junction region 110 connected to the second contact plug 108 applied with the pumping voltage VPP and the floating gate 104 having negative potential by electrons therein, BTBT occurs therebetween. As hot holes which are generated by the occurrence of BTBT between the second junction region 110 and the floating gate 104 are injected into the floating gate 104 and the injected hot holes are coupled with electrons, the unit cell may be erased through a series of behaviors through which the threshold voltage of the floating gate 104 is decreased.

As known by those skilled in art, the band-to-band tunneling occurs between the valence band of a given conductivity (e.g., p-type region) and the conduction band of another conductivity (e.g., n-type region). The band-to-band tunneling occurs if an electron in the valence band of the semiconductor tunnels across the band gap to the conduction band without the assistance of traps.

In an erase operation of a non-programmed cell, the floating gate 104 is not coupled during the erase operation since the first contact plug 107 is applied with the ground voltage GND. In this state, the floating gate 104 of the non-programmed cell has ground (GND) potential since an amount of extra electrons in the floating gate 104 is negligible, and thus, BTBT does not occur between the floating gate 104 and the second junction region 110 although the second contact plug 108 is applied with the pumping voltage VPP. Accordingly, the threshold voltage of the non-programmed cell remains the same.

A read operation of the unit cell of the nonvolatile memory device in accordance with an embodiment of the present invention will be described below with reference to Table 1 and FIG. 4C.

A read operation may use forward read in which read is performed through charge migration in the same direction as the migrating direction of charges in the program operation. The read operation may be performed by applying a read voltage VREAD and the ground voltage GND to the first contact plug 107 and the second contact plug 108 respectively. The read voltage VREAD may be a positive voltage that is smaller than the program voltage Vpp. For instance, the read voltage VREAD may be a voltage (~1V) equal to or smaller than 1V. For reference, because the forward read may realize a cell array with a simple structure, it provides advantages in that it is easy to improve the degree of integration and lessen the difficulty of processing.

In detail, the floating gate 104 is coupled by the read voltage VREAD which is applied to the first contact plug 107, and whether or not a channel is to be formed under the floating gate 104 is determined depending upon whether or not electrons are present in the floating gate 104. The unit cell may be read in such a way as to sense this.

Below, a cell array of the nonvolatile memory device which may be realized on the basis of the above-described unit cell of the nonvolatile memory device in accordance with an embodiment of the present invention and the operation methods thereof will be described. In the following embodiments for a cell array, the same reference numerals as those of FIGS. 1A and 1B will be used to explain unit cells, and detailed descriptions for components with the same reference numerals will be omitted herein.

Figure 5A:
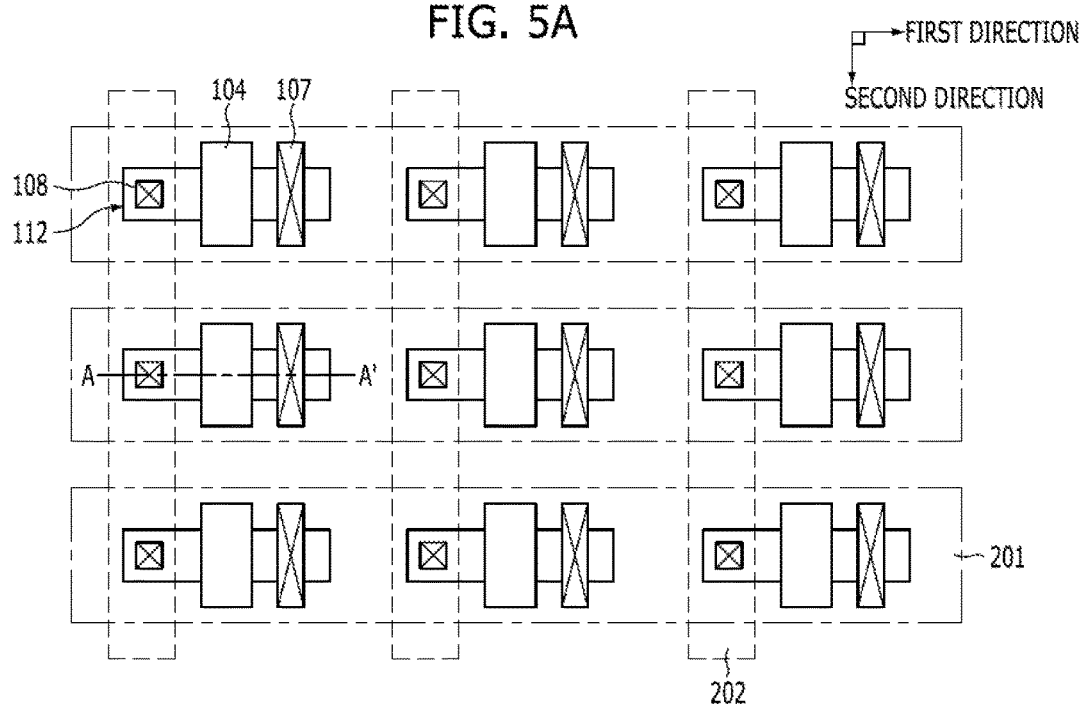
FIGS. 5A and 5B are views illustrating a cell array of a nonvolatile memory device in accordance with an embodiment of the present invention.
Figure 5B:
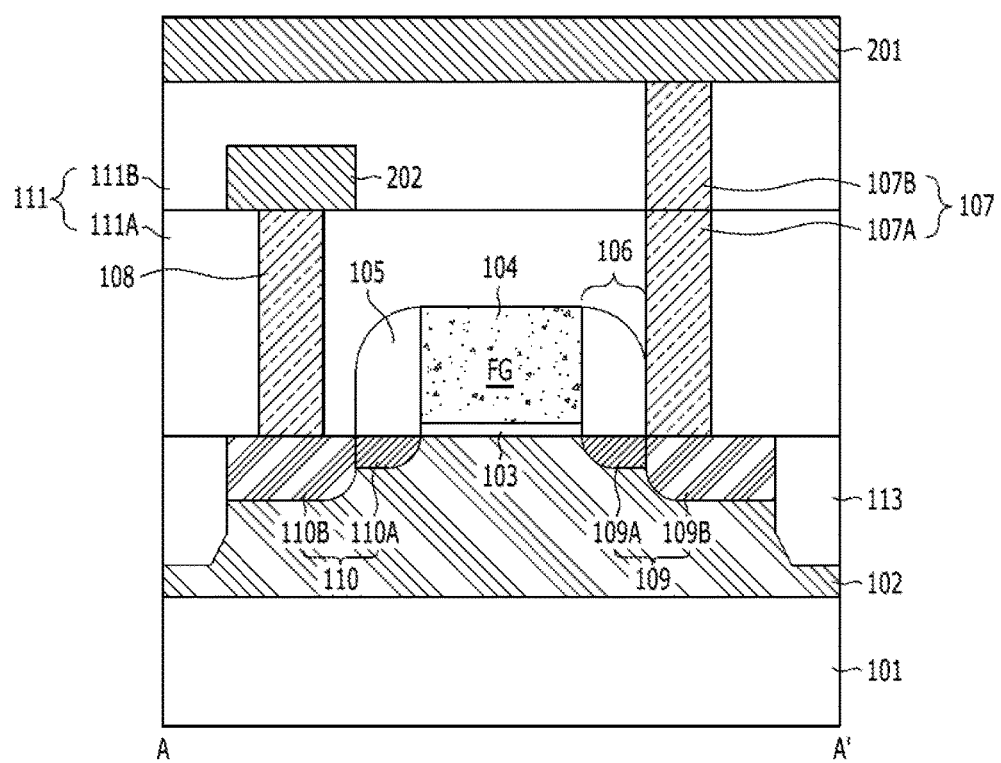

FIGS. 5A and 5B are views illustrating a cell array of a nonvolatile memory device in accordance with an embodiment of the present invention. In detail, FIG. 5A is a plan view and FIG. 5B is a cross-sectional view taken along the line A-A' of FIG. 5A.

Referring to FIGS. 5A and 5B, a nonvolatile memory device in accordance with an embodiment of the present invention includes a substrate 101 including a plurality of active regions 112, floating gates 104 which are formed on the respective active regions 112, spacers 105 which are formed on the sidewalls of the floating gates 104, first contact plugs 107 which are formed on first sides of the floating gates 104 and contact the spacers 105, second contact plugs 108 which are formed on second opposing sides of the floating gates 104, first conductive lines 201 each of which contacts a plurality of first contact plugs 107 disposed in the first direction, and second conductive lines 202 each of which contacts a plurality of second contact plugs 108 disposed in the second direction.

A nonvolatile memory device in accordance with an embodiment of the present invention may further include first junction regions 109 which are formed in the active regions 112 on the first sides of the floating gates 104 and contact the first contact plugs 107, second junction regions 110 which are formed in the active regions 112 on the second sides of the floating gates 104 and contact the second contact plugs 108, a first interlayer dielectric layer 111A which is formed over the surface of the substrate 101, and a second interlayer dielectric layer 111B which is formed on the first interlayer dielectric layer 111A. The first contact plugs 107 may contact the first conductive lines 201 by passing through the interlayer dielectric layer 111, and the second contact plugs 108 may contact the second conductive lines 202 passing through the first interlayer dielectric layer 111A.

The plurality of active regions 112 may have a matrix type layout structure by being separated from one another by predetermined distances in a first direction and a second direction, and may be defined by an isolation structure 113 which is formed in the substrate 101. Each of the active regions 112 may be a bar type or a line type which has a major axis extending in the first direction and a minor axis extending in the second direction.

The first contact plugs 107 perform the function of electrically connecting the first conductive lines 201 on the interlayer dielectric layer 111 with the first junction regions 109 and serve as control gates for coupling the floating gates 104. The floating gates 104 may be coupled in response to a bias (for example, a voltage) applied to the first contact plugs 107 through the first conductive lines 201. To this end, the first contact plugs 107 may be disposed parallel and adjacent to the floating gates 104 with gaps 106 defined therebetween, and may contact the spacers 105 formed on the sidewalls of the floating gates 104. In other words, the first contact plugs 107 may have sidewalls facing at least one sidewall of the floating gates 104, and the spacers 105 between the floating gates 104 and the first contact plugs 107, that is, the spacers 105 formed in the gaps 106, serve as a dielectric layer (for example, an IPD).

The first contact plugs 107 which pass through the interlayer dielectric layer 111 may include first plugs 107A which pass through the first interlayer dielectric layer 111A and second plugs 107B which pass through the second interlayer dielectric layer 111B. The first plugs 107A may be bar types, and the second plugs 107B may be bar types or hole types.

The first conductive lines 201 which contact the first contact plugs 107 may be bit lines. The first conductive lines 201 which extend in the first direction may be controlled in the width thereof in the second direction according to the type of the first contact plugs 107. In detail, while the first conductive lines 201 have shapes which cover the second plugs 107B, the width of the first conductive lines 201 in the second direction may be larger in an embodiment in which the second plugs 107B are bar types than in an embodiment in which the second plugs 107B are hole types.

The second contact plugs 108 may have shapes different from those of the first contact plugs 107. For instance, the second contact plugs 108 may be hole types. The second contact plugs 108 connect the second conductive lines 202 with the second junction regions 110, and a bias (for example, a voltage) applied to the second contact plugs 108 through the second conductive lines 202 does not exert a direct influence on the floating gates 104. Specifically, the floating gates 104 are not coupled in response to the bias applied by the second contact plugs 108. To this end, an area through which a sidewall of the second contact plugs 108 and a sidewall of the floating gates 104 face each other may be smaller than an area through which one or more sidewall of the first contact plugs 107 and one or more sidewall of the floating gates 104 face each other. Furthermore, a distance between the second contact plugs 108 and the floating gates 104 may be longer than a distance between the floating gates 104 and the first floating gates 107. In an embodiment, the first conductive plug 107 has a cross-sectional area, parallel to the main surface area of the substrate 101 (see FIG. 5A), that is at least 3 times greater than that of the second conductive plug 108 so that the coupling ratio between the floating gate 104 and the first contact plug 107 would be high. In an embodiment, the first conductive plug 107 has a cross-sectional area, parallel to the main surface area of the substrate 101 (see FIG. 5A), that is at least 4, 5, 6, 7, or 10 or greater than that of the second conductive plug 108 so that the coupling ratio between the floating gate 104 and the first contact plug 107 would be high. For example, the first contact plug 107 may a single bar shape as in FIG. 5A, or two or three bar shaped connect together, or may have "C" shape having an opening on the side facing the second contact plug 108.

The second conductive lines 202 which contact the second contact plugs 108 may be word lines. The second conductive lines 202 may be line type patterns which extend in the second direction. The first conductive lines 201 and the second conductive lines 202 may include one or more metallic layer.

Since a nonvolatile memory device with the above-described structure has a floating gate 104 and a first contact plug 107 serving as a control gate for coupling the floating gate 104, the degree of integration and operation characteristics of the nonvolatile memory device may be improved when compared to a single gate EEPROM.

Moreover, in a nonvolatile memory device with the above-described structure, because the first contact plug 107 is used as a control gate and the spacer 105 between the first contact plug 107 and the floating gate 104 serves as a dielectric layer, it is possible to fabricate a nonvolatile memory device without separate additional processes for forming a control gate.

Figure 6A:
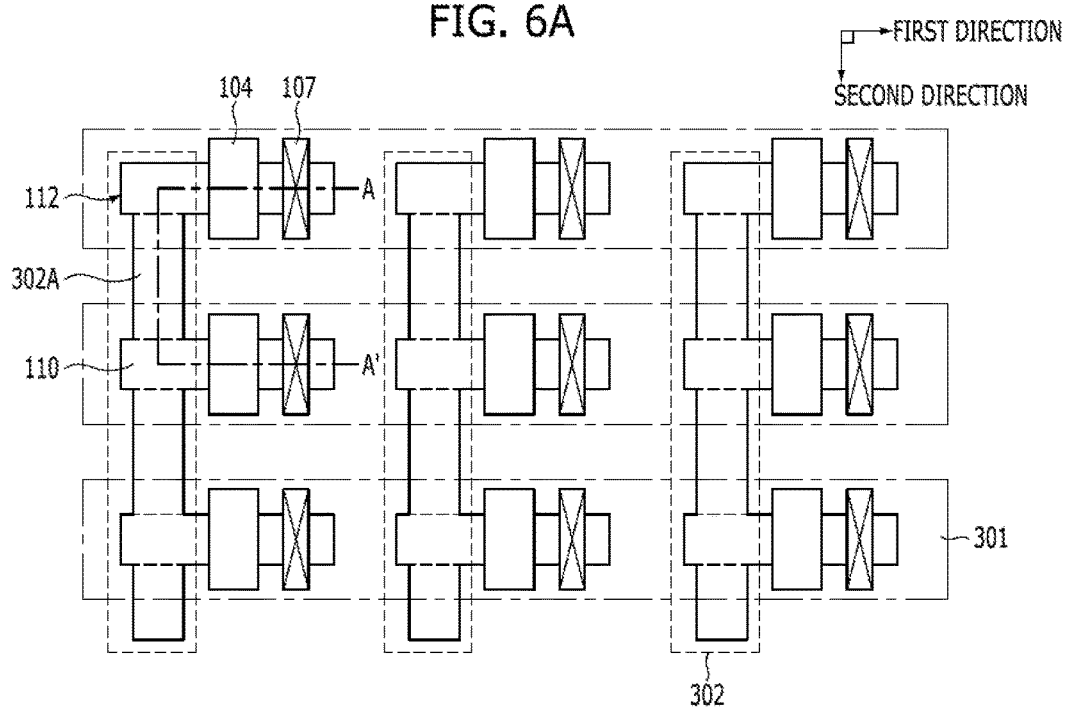
FIGS. 6A and 6B are views illustrating a cell array of a nonvolatile memory device in accordance with an embodiment of the present invention.
Figure 6B:
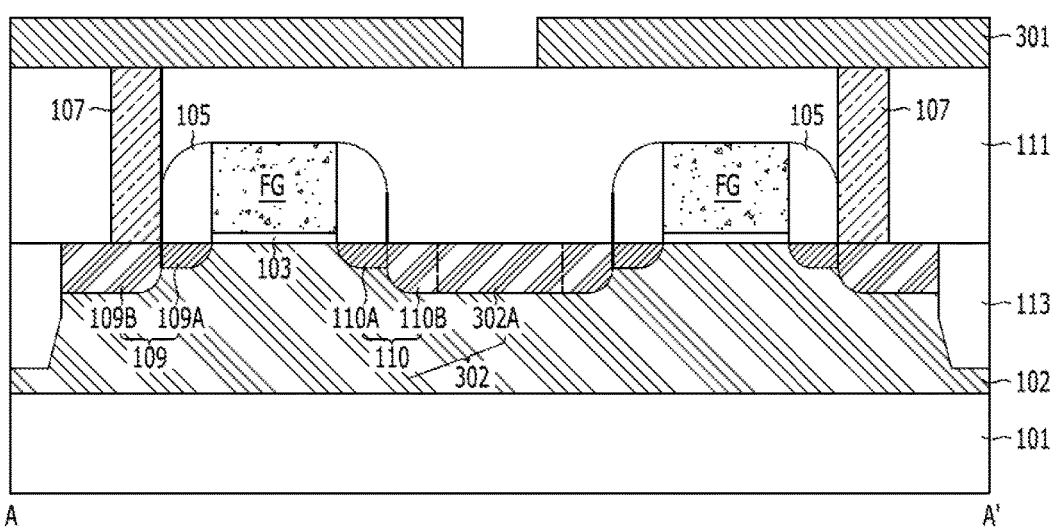

FIGS. 6A and 6B are views illustrating a cell array of a nonvolatile memory device in accordance with an embodiment of the present invention. In detail, FIG. 6A is a plan view and FIG. 6B is a cross-sectional view taken along the line A-A' of FIG. 6A.

Referring to FIGS. 6A and 6B, a nonvolatile memory device in accordance with an embodiment of the present invention includes a substrate 101 including a plurality of active regions 112, floating gates 104 which are formed on the respective active regions 112, contact plugs 107 which are formed on first sides of the floating gates 104 and are disposed parallel to the floating gates 104 with gaps 106 defined therebetween, spacers 105 which are formed on the sidewalls of the floating gates 104 and fill the gaps 106, first conductive lines 301 each of which contacts a plurality of contact plugs 107 disposed in the first direction, and second conductive lines 302 each of which connects a plurality of active regions 112 in the second direction.

A nonvolatile memory device in accordance with an embodiment of the present invention may further include first junction regions 109 which are formed in the active regions 112 on the first sides of the floating gates 104 and contact the contact plugs 107, second junction regions 110 which are formed in the active regions 112 on second, opposing sides of the floating gates 104, connection parts 302A which connect the second junction regions 110 adjacent to each other in the second direction, and an interlayer dielectric layer 111 which is formed on the surface of the substrate 101. The connection parts 302A may be impurity regions which are formed in the substrate 101, and the contact plugs 107 may contact the first conductive lines 301 by passing through the interlayer dielectric layer 111.

The plurality of active regions 112 may have a matrix type layout structure by being separated from one another by predetermined distances in a first direction and a second direction, and may be defined by an isolation structure 113 which is formed in the substrate 101. Each of the active regions 112 may be a bar type or a line type which has a major axis extending in the first direction and a minor axis extending in the second direction.

The contact plugs 107 perform the function of electrically connecting the first conductive lines 301 on the interlayer dielectric layer 111 with the first junction regions 109 and serve as control gates for coupling the floating gates 104. That is to say, the floating gates 104 may be coupled in response to the bias (for example, a voltage) applied to the contact plugs 107 through the first conductive lines 301. To this end, the contact plugs 107 may be disposed parallel and adjacent to the floating gates 104 with the gaps 106 defined therebetween, and may have shapes which contact the spacers 105 formed on the sidewalls of the floating gates 104. In other words, the contact plugs 107 may have shapes which have sidewalls facing at least one sidewall of the floating gates 104, and the spacers 105 between the floating gates 104 and the contact plugs 107, that is, the spacers 105 formed in the gaps 106, serve as a dielectric layer (for example, an IPD).

The first conductive lines 301 which contact the contact plugs 107 may be bit lines. The first conductive lines 301 of line types which extend in the first direction may have shapes which cover the contact plugs 107. That is to say, the width of the first conductive lines 301 may be larger than the size of the contact plugs 107 in the second direction. The first conductive lines 301 may include a metallic layer.

The second conductive lines 302 may be word lines. The second conductive lines 302 may include impurity regions which are formed in the substrate 101. In detail, the second conductive lines 302 may include the connection parts 302A which connect adjacent second junction regions 110 formed in the active regions 112, and may have shapes in which the second junction regions 110 and the connection parts 302A are alternately disposed.

Since a nonvolatile memory device with the above-described structure has the floating gate 104 and the contact plug 107 serving as a control gate for coupling the floating gate 104, the degree of integration and operation characteristics of the nonvolatile memory device may be improved when compared to a single gate EEPROM.

Moreover, in the nonvolatile memory device with the above-described structure, due to the fact that the contact plug 107 is used as a control gate and the spacer 105 between the contact plug 107 and the floating gate 104 serves as a dielectric layer, it is possible to fabricate the nonvolatile memory without a separate additional process for forming a control gate.

Figure 7:
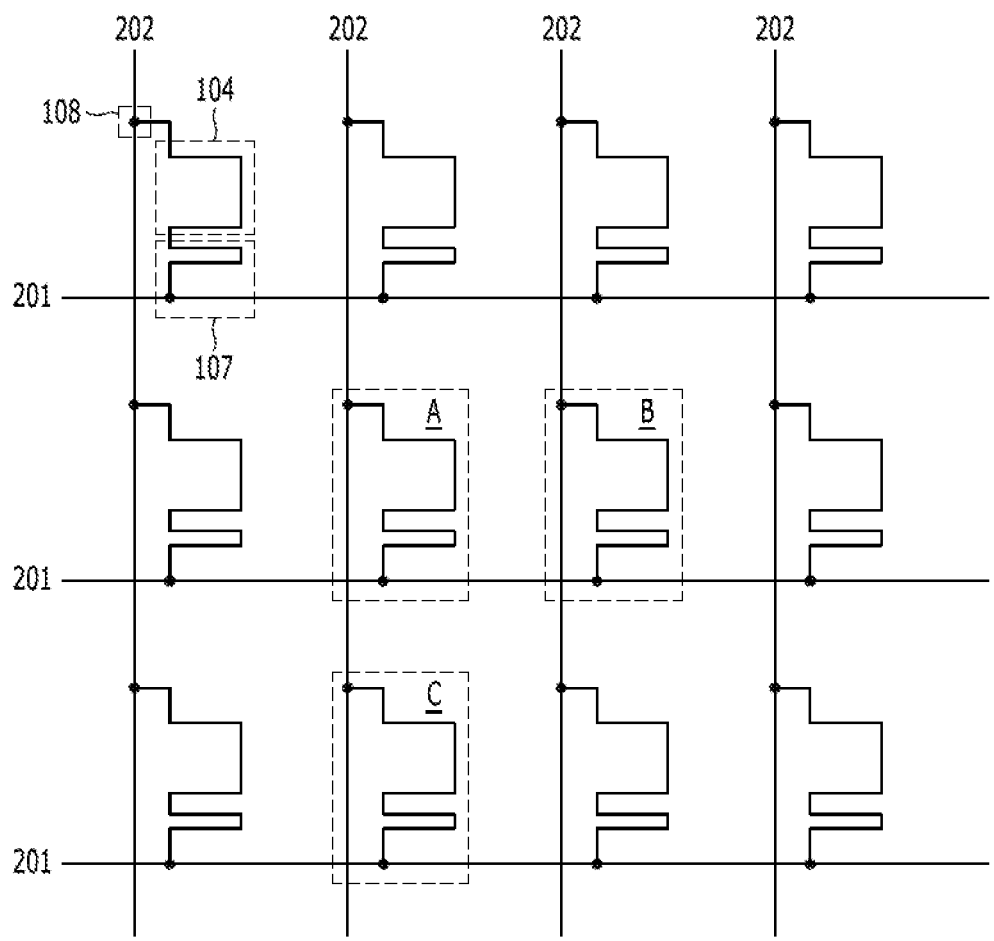
FIG. 7 is an equivalent circuit diagram of a cell array of a nonvolatile memory device in accordance with an embodiment of the present invention.

Hereafter, a program operation, an erase operation and a read operation will be described with reference to FIG. 7 which schematically shows an equivalent circuit diagram for the cell array shown in FIG. 5A and the cell array shown in FIG. 6A and Table 2 which shows cell array operating conditions of the nonvolatile memory device in accordance with an embodiment of the present invention. For the sake of convenience in explanation, the same reference numerals as those of FIGS. 5A and 5B will be used in FIG. 7.

TABLE 2

| Classification | | | Program (IPD) | Erase | Read |
|---|---|---|---|---|---|
| Selected cell (A) | Scheme | | HCI | BTBT | — |
| | Coupling gate | | Coupling | Non-coupling | Coupling |
| | First Conductive line | | VPP | GND | VREAD (~1 V) |
| | Second conductive line | | GND | VPP | GND |
| | Substrate (or well) | | GND | GND | GND |
| Unselected Cell | Cell (B) sharing first conductive line | Coupling gate | Coupling | Non-coupling | Coupling |
| | | First Conductive line | VPP | GND | VREAD (~1 V) |
| | | Second conductive line | Floating | Floating | Floating |
| | | Substrate (or well) | GND | GND | GND |
| | Cell (C) sharing second conductive line | Coupling gate | Non-coupling | Non-coupling | Non-coupling |
| | | First Conductive line | GND | GND | GND |
| | | Second conductive line | GND | VPP | GND |
| | | Substrate (or well) | GND | GND | GND |

First, a program operation may use HCI. In detail, as a program voltage and a ground voltage GND are respectively applied to the first conductive line 201 and the second conductive line 202 which are connected to a selected cell A, charges (for example, electrons) are injected into the floating gate 104, and thus, the selected cell A may be programmed so that the threshold voltage of the memory cell A is increased. The program voltage may be a positive voltage. For instance, the program voltage may be a pumping voltage VPP.

In an unselected cell B which shares the first conductive line 201 connected to the selected cell A, although the floating gate 104 is coupled by the program voltage, since the second conductive line 202 which is connected to the unselected cell B is floated, the unselected cell B is not programmed. Further, in an unselected cell C which shares the second conductive line 202 connected to the selected cell A, the ground voltage GND is applied to the first conductive line 201 connected to the unselected cell C and thus the floating gate 104 is not coupled, so the unselected cell C is not programmed.

Next, an erase operation may use BTBT. In detail, as the ground GND and an erase voltage are respectively applied to the first conductive line 201 and the second conductive line 202 which are connected to the selected cell A, charges (for example, holes) are injected into the floating gate 104, and thus, the selected cell A may be erased so that the threshold voltage of the selected cell A is decreased. The erase voltage may be a positive voltage. For instance, the erase voltage may be the pumping voltage VPP.

In the unselected cell B which shares the first conductive line 201 connected to the selected cell A, since the floating gate 104 is not coupled by the ground voltage GND applied to the first conductive line 201 and the second conductive line 202 which is connected to the unselected cell B is floated, the unselected cell B is not erased. In an embodiment, the unselected cell C which shares the second conductive line 202 connected to the selected cell A may be erased in the same manner as the selected cell A. In this regard, a plurality of unit cells which share the second conductive line 202 may be collectively erased in the same erase operation.

A read operation may use forward read in which read is performed through charge migration in the same direction as the migrating direction of charges in the program operation. In detail, as a read voltage VREAD and the ground voltage GND are respectively applied to the first conductive line 201 and the second conductive line 202 which are connected to the selected cell A, the selected cell A may be read in such a way as to sense whether a channel is formed under the floating gate 104 (or the memory cell is turned ON). The read voltage VREAD may be a positive voltage. For instance, the read voltage VREAD may be a voltage (~1V) equal to or smaller than 1V.

In the unselected cell B which shares the first conductive line 201 connected to the selected cell A, although the floating gate 104 is coupled by the read voltage VREAD, since the second conductive line 202 which is connected to the unselected cell B is floated, the unselected cell B is read. Further, in the unselected cell C which shares the second conductive line 202 connected to the selected cell A, since the ground voltage GND is applied to the first conductive line 201 connected to the unselected cell C, the floating gate 104 is not coupled, and the unselected cell C is not read.

Figure 8A:
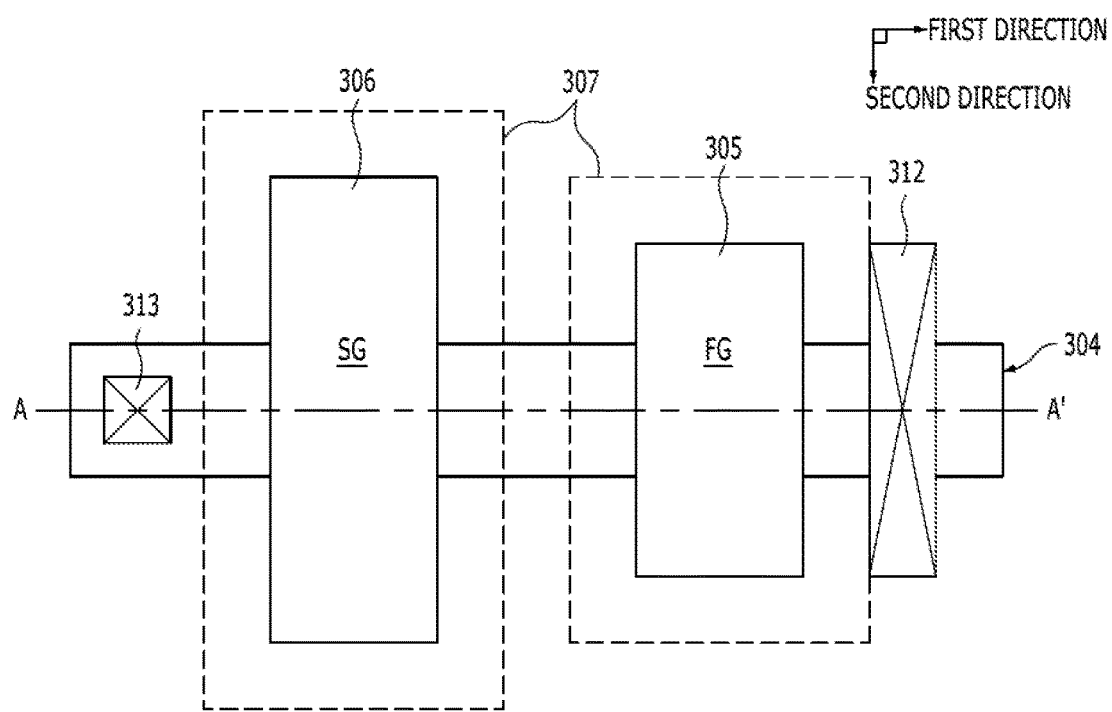
FIGS. 8A and 8B are views illustrating a unit cell of a nonvolatile memory device in accordance with an embodiment of the present invention.
Figure 8B:
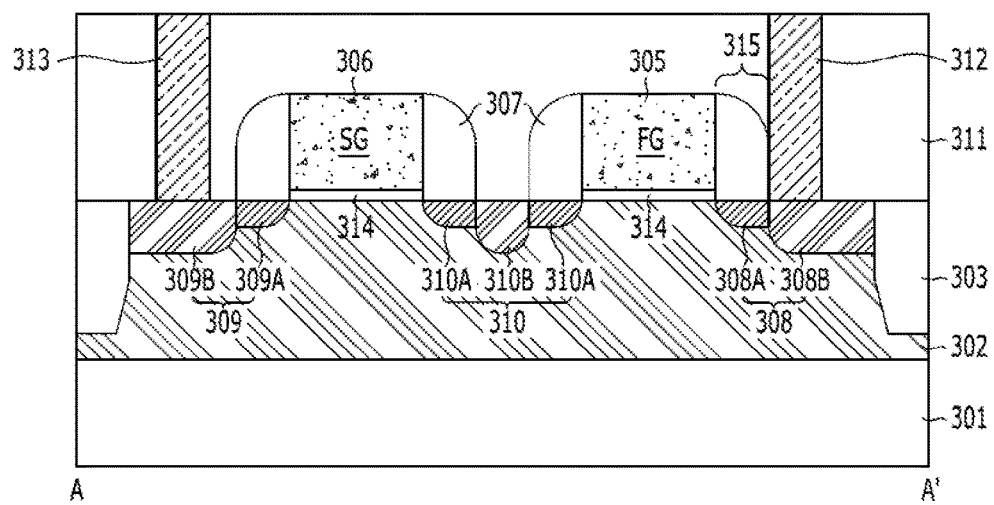

FIGS. 8A and 8B are views illustrating a variation of the unit cell of the nonvolatile memory device in accordance with the embodiment of the present invention. In detail, FIG. 8A is a plan view, and FIG. 8B is a cross-sectional view taken along the line A-A' of FIG. 8A.

Referring to FIGS. 8A and 8B, a variation of the unit cell of the nonvolatile memory device in accordance with an embodiment of the present invention includes a select gate 306 which is formed on a substrate 301, a floating gate 305 which neighbors the select gate 306 formed on the substrate 301, spacers 307 which are formed on the sidewalls of the floating gate 305 and the select gate 306, and a first contact plug 312 which contacts the spacer 307 adjacent to the floating gate 305.

An isolation structure 303 which defines a well 302 of the first conductivity type and an active region 304 is formed in the substrate 301. The substrate 301 may be a bulk silicon substrate or a silicon-on-insulator (SOI) substrate. The isolation structure 303 may be formed through a shallow trench isolation (STI) process, and may include a dielectric layer. The active region 304 which is defined by the isolation structure 303 may be a bar type or a line type which has a major axis extending in a first direction and a minor axis extending in a second direction crossing with (or perpendicular to) the first direction.

The select gate 306 performs the function of preventing over-erase, and the floating gate 305 performs the function of storing information. The select gate 306 and the floating gate 305 may be simultaneously formed. The select gate 306 and the floating gate 305 may be bar types. The select gate 306 and the floating gate 305 may include a silicon-containing substance. In detail, the select gate 306 and the floating gate 305 may be a polysilicon layer. The polysilicon layer may include a doped polysilicon layer doped with impurities or an undoped polysilicon layer not doped with impurities. Although the select gate 306 and the floating gate 305 are planar gates in the embodiment shown in FIGS. 8A and 8B, in another embodiment, the select gate 306 and the floating gate 305 may have three-dimensional gate structures, for example, fin gate structures.

The spacers 307 which are formed on the sidewalls of the select gate 306 and the floating gate 305 may include a dielectric layer, which may be similar to gate dielectric layer 314. In detail, the gate dielectric layer 314 and the spacers 307 may include an oxide layer, a nitride layer, an oxynitride layer, or a stack layer thereof.

A first junction region 308 is formed in the substrate 301 on a first side of the floating gate 305, a second junction region 309 is formed on a second opposing side of the select gate 306, and a third junction region 310 is formed between the floating gate 305 and the select gate 306. The first junction region 308 to the third junction region 310 may be impurity regions which are formed by ion-implanting impurities of the second conductivity type into the substrate 301, and may have LDD structures. In detail, the first junction region 308 to the third junction region 310 include first impurity regions 308A, 309A and 310A of the second conductivity type and second impurity regions 308B, 309B and 310B of the second conductivity type. The impurity doping concentration of the second impurity regions 308B, 309B and 310B may be larger than the impurity doping concentration of the first impurity regions 308A, 309A and 310A.

An interlayer dielectric layer 311 is formed on the entire surface of the substrate 301, and a first contact plug 312 and a second contact plug 313 may be connected to the first junction region 308 and the second junction region 309, respectively by passing through the interlayer dielectric layer 311. The first contact plug 312 may be a bar type, and the second contact plug 313 may be a hole type.

The first contact plug 312 serves as a control gate for coupling the floating gate 305. In other words, the floating gate 305 may be coupled in response to the bias (for example, a voltage) applied by the first contact plug 312. To this end, the first contact plug 312 may be disposed parallel and adjacent to the floating gate 305 with a gap 315 defined therebetween, and may have a shape which contacts the spacer 307 formed on sidewalls of the floating gate 305. The first contact plug 312 may have a shape which has a sidewall facing at least one sidewall of the floating gate 305, and the spacer 307 between the floating gate 305 and the first contact plug 312, that is, the spacer 307 formed in the gap 315, serves as a dielectric layer (for example, an IPD).

Since the nonvolatile memory device with the above-described structure has the floating gate 305 and the first contact plug 312 serving as a control gate for coupling the floating gate 305, the degree of integration and operation characteristics of the nonvolatile memory device may be improved when compared to a single gate EEPROM.

Also, since the nonvolatile memory device with the above-described structure has the select gate 306 which prevents over-erase, the operation characteristics of the nonvolatile memory device may be further improved.

Moreover, in a nonvolatile memory device with the above-described structure, because the first contact plug 312 is used as a control gate and the spacer 307 between the first contact plug 312 and the floating gate 305 serves as a dielectric layer, it is possible to fabricate the nonvolatile memory device without a separate additional process for forming a control gate.

Figure 9A:
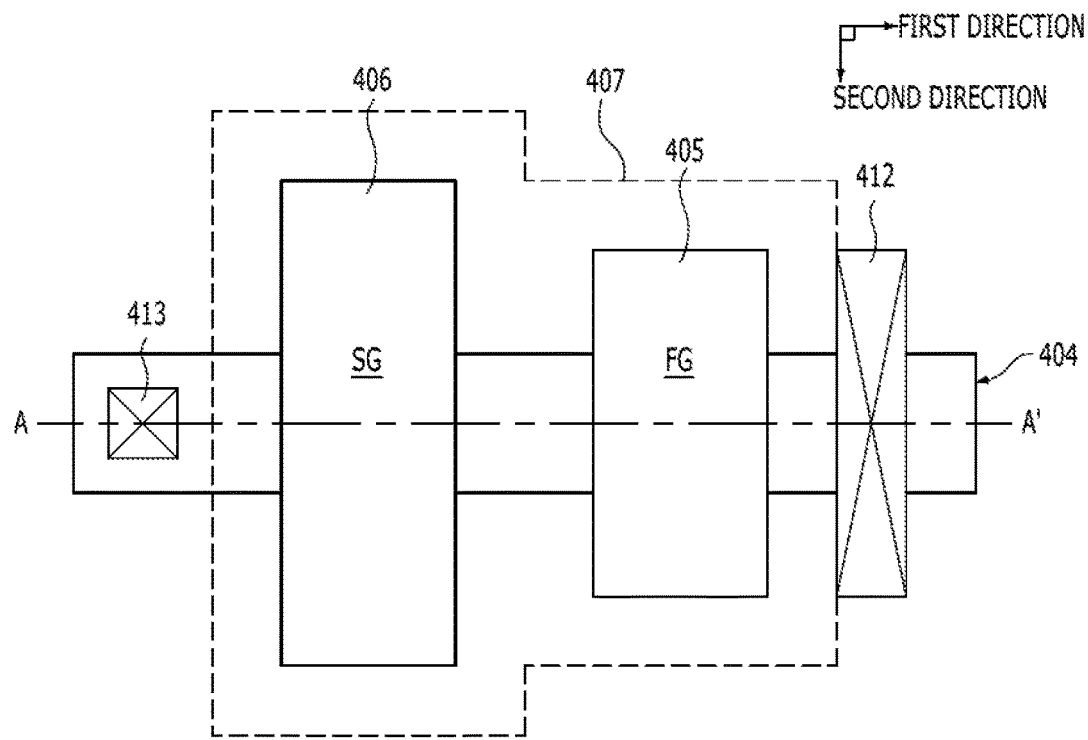
FIGS. 9A and 9B are views illustrating a unit cell of a nonvolatile memory device in accordance with an embodiment of the present invention.
Figure 9B:
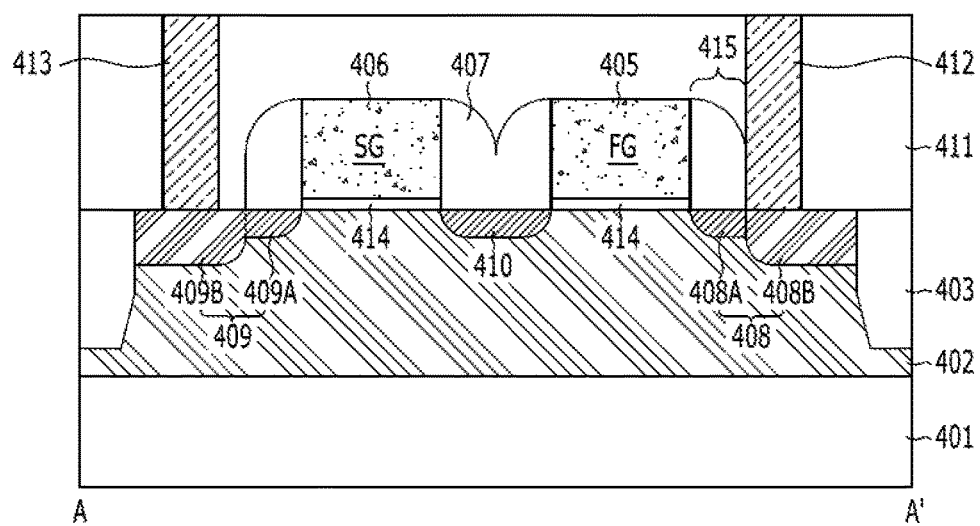

FIGS. 9A and 9B are views illustrating another variation of the unit cell of the nonvolatile memory device in accordance with an embodiment of the present invention. In detail, FIG. 9A is a plan view, and FIG. 9B is a cross-sectional view taken along the line A-A' of FIG. 9A.

Referring to FIGS. 9A and 9B, a unit cell according to an embodiment of the present invention includes a select gate 406 which is formed on a substrate 401, a floating gate 405 which is formed on the substrate 401 and neighbors the select gate 406, spacers 407 which are formed on sidewalls of the floating gate 405 and the select gate 406 and fill the space between the select gate 406 and the floating gate 406, and a first contact plug 412 which contacts the spacer 407 adjacent to the floating gate 405.

An isolation structure 403 which defines a well 402 of the first conductivity type and an active region 404 is formed in the substrate 401. The substrate 401 may be a bulk silicon substrate or a silicon-on-insulator (SOI) substrate. The isolation structure 403 may be formed through a shallow trench isolation (STI) process, and may include a dielectric layer. The active region 404 which is defined by the isolation structure 403 may be a bar type or a line type which has a major axis extending in a first direction and a minor axis extending in a second direction crossing with (or perpendicular to) the first direction.

The select gate 406 prevents over-erase and serves as a control gate for coupling the floating gate 405, and the floating gate 405 performs the function of storing information. Since a first portion of the spacer 407 fills the space between the select gate 406 and the floating gate 405, and the first portion of the spacer 407 formed between the select gate 406 and the floating gate 405 serves as a dielectric layer (for example, an IPD), so that the floating gate 405 may be coupled in response to the bias (for example, a voltage) applied to the select gate 406. The floating gate 405 may have a sidewall which faces at least one sidewall of the select gate 406.

The select gate 406 and the floating gate 405 may be simultaneously formed. The select gate 406 and the floating gate 405 may be bar types. The select gate 406 and the floating gate 405 may include a silicon-containing substance. In detail, the select gate 406 and the floating gate 405 may be a polysilicon layer. The polysilicon layer may be a doped polysilicon layer doped with impurities or an undoped polysilicon layer not doped with impurities. While the select gate 406 and the floating gate 405 in the embodiment show in FIGS. 9A and 9B are planar gates, in another embodiment the select gate 406 and the floating gate 405 may have three-dimensional gate structures, for example, fin gate structures.

The first portion of the spacers 407 which are formed on sidewalls of the select gate 406 and the floating gate 405 may include a dielectric layer, similar to gate dielectric layer 414 which is formed between the select gate 406 and the floating gate 405 and the substrate 401. In detail, the gate dielectric layer 414 and the spacers 407 may include an oxide layer, a nitride layer, an oxynitride layer, or a stack layer thereof.

A first junction region 408 is formed in the substrate 401 on a first side of the floating gate 405, a second junction region 409 is formed on a second opposing side of the select gate 406, and a third junction region 410 is formed between the floating gate 405 and the select gate 406. The first junction region 408, second junction region 409, and third junction region 410 may be impurity regions which are formed by ion-implanting impurities of the second conductivity type into the substrate 401. The first junction region 408 and the second junction region 409 may have LDD structures.

In detail, the first junction region 408 and the second junction region 409 include first impurity regions 408A and 409A of the second conductivity type and second impurity regions 408B and 409B of the second conductivity type. The impurity doping concentration of the second impurity regions 408B and 409B may be larger than the impurity doping concentration of the first impurity regions 408A and 409A. The third junction region 410 may be formed during a process for forming the first impurity regions 408A and 409A.

An interlayer dielectric layer 411 is formed on the surface of the substrate 401, and a first contact plug 412 and a second contact plug 413 may be connected to the first junction region 408 and the second junction region 409, respectively, by passing through the interlayer dielectric layer 411. The first contact plug 412 may be a bar type, and the second contact plug 413 may be a hole type.

The first contact plug 412 serves as the control gate for coupling the floating gate 405, in cooperation with the select gate 406. In other words, the floating gate 405 may be coupled in response to a bias (for example, a voltage) applied by the first contact plug 412. To this end, the first contact plug 412 may be disposed parallel and adjacent to the floating gate 405 with a gap 415 defined therebetween, and may have a shape which contacts the spacer 407 formed on sidewalls of the floating gate 405. The first contact plug 412 may have a shape which has a sidewall facing at least one sidewall of the floating gate 405, and a second portion of the spacer 407 between the floating gate 405 and the first contact plug 412, that is, the second portion of spacer 407 formed in the gap 415, serves as a dielectric layer (for example, an IPD).

Since a nonvolatile memory device with the above-described structure has the floating gate 405 and the first contact plug 412 serving as a control gate for coupling the floating gate 405, the degree of integration and operation characteristics of the nonvolatile memory device may be improved when compared to a single gate EEPROM.

Also, since the nonvolatile memory device with the above-described structure has the select gate 406 which prevents over-erase, the operation characteristics of the nonvolatile memory device may be further improved.

In addition, since the spacer 407 has a shape which fills the space between the select gate 406 and the floating gate 405, the select gate 406 may serve as a control gate in cooperation with the first contact plug 412, whereby it is possible to further improve the operation characteristics of a nonvolatile memory device.

Moreover, in a nonvolatile memory device with the above-described structure, because the first contact plug 412 is used as a control gate and the spacer 407 between the first contact plug 412 and the floating gate 405 serves as a dielectric layer, it is possible to fabricate a nonvolatile memory device without a separate additional process for forming a control gate.

Figure 10:
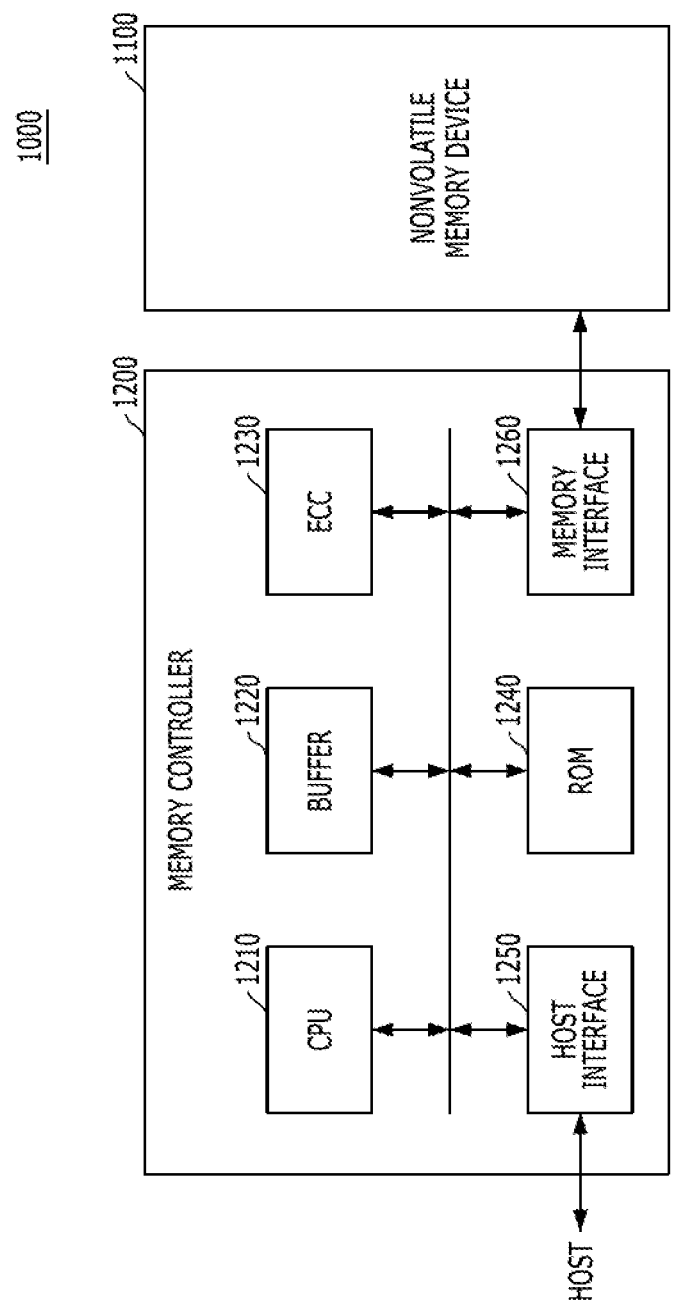
FIG. 10 is a block diagram showing a memory system including a nonvolatile memory device in accordance with an embodiment of the present invention.

FIG. 10 is a block diagram showing a memory system including a nonvolatile memory device in accordance with an embodiment of the present invention.

Referring to FIG. 10, a memory system 1000 may include a nonvolatile memory device 1100, and a memory controller 1200 configured to control data exchanged between a host HOST and the nonvolatile memory device 1100. The nonvolatile memory device 1100 is realized by including a unit cell, operating method and cell array of a nonvolatile memory device in accordance with embodiments of the present invention. The memory controller 1200 may include a CPU 1210, a buffer 1220, an ECC circuit 1230, a ROM 1240, a host interface 1250, and a memory interface 1260.

The memory system 1000 may be provided in the form of a personal digital assistant (PDA), a portable computer, a web tablet, a wireless phone, a mobile phone, a digital music player, a memory card, electronic products capable of transmitting and/or receiving information in a wireless environment, a solid state drive, a camera image sensor, and an application chipset.

A nonvolatile memory device in accordance with an embodiment of the present invention and an application device including the same may be included in various types of packages. For example, a nonvolatile memory device and application device including the same may be packaged and mounted in the form of a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat package (MQFP), a small outline (SOIC), a shrink small outline package (SSOP), a thin small outline package (TSOP), a thin quad flat package (TQFP), a system in package (SIP), a multi-chip package (MCP), a wafer-level fabricated package (WFP), a wafer-level processed stack package (WSP), and wafer-level chip scale packages (WLCSPs).

As is apparent from the above descriptions, in embodiments of the present invention, since a contact plug is used as a control gate and a spacer between a first contact plug and a floating gate serves as a dielectric layer, a nonvolatile memory device may be fabricated without a separate additional process for forming a control gate.

Also, in embodiments of the present invention, since the nonvolatile memory device has the floating gate and the contact plug which serves as the control gate for coupling the floating gate, the degree of integration and the operation characteristics of the nonvolatile memory device may be improved.

Further, in embodiments of the present invention, because the spacer between the floating gate and the contact plug serves as a dielectric layer, a fabrication process may be simplified and the degree of integration may be increased, and a coupling ratio between the floating gate and the contact plug may be increased as the degree of integration increases.

Although various embodiments have been described for illustrative purposes, it will be apparent to those skilled in the art that various changes and modifications may be made without departing from the spirit and scope of the invention as defined in the following claims.

What is claimed is:

1. A method for fabricating a nonvolatile memory device, comprising:
    forming a gate conductive layer over a substrate which has a logic region and a memory region;
    selectively etching the gate conductive layer and forming a gate in the logic region and a floating gate in the memory region;
    forming spacers on sidewalls of the gate and the floating gate;
    forming an interlayer dielectric layer over an upper surface of the substrate; and
    forming a first contact plug and a second contact plug which pass through the interlayer dielectric layer on first and second sides of the floating gate,
    wherein the first contact plug is formed to contact the spacer,
    wherein the floating gate and the first contact plug have a major axis in a second direction and a minor axis in a first direction perpendicular to the second direction, and
    wherein the floating gate and the first contact plug are extended in the second direction.

2. The method according to claim 1, wherein the first contact plug is formed to have a sidewall which faces a sidewall of the floating gate.

3. The method according to claim 1, wherein the first contact plug and the second contact plug are formed to have different shapes.

4. The method according to claim 1, wherein the first contact plug is a bar type, and the second contact plug is a hole type.

5. The method according to claim 1, wherein a distance between the floating gate and the second contact plug is larger than a distance between the floating gate and the first contact plug.

6. The method according to claim 1, wherein a first facing area through which sidewalls of the floating gate and the first contact plug face each other is larger than a second facing area through which sidewalls of the floating gate and the second contact plug face each other.

7. A nonvolatile memory device comprising:
    a substrate having a plurality of active regions;
    floating gates formed over the respective active regions;
    spacers formed on sidewalls of the floating gates;
    first contact plugs formed on first sides of the floating gates and contacting the spacers;
    second contact plugs formed on second opposing sides of the floating gates;
    first conductive lines each contacting a plurality of first contact plugs which are arranged in a first direction; and
    second conductive lines each contacting a plurality of second contact plugs which are arranged in a second direction crossing the first conductive lines,
    wherein the first contact plug and the floating gate have a sufficiently large overlapping area to enable the first contact plug to operate as a control gate for the floating gate.

8. The nonvolatile memory device according to claim 7, further comprising:
    a first interlayer dielectric layer formed over an upper surface of the substrate; and
    a second interlayer dielectric layer formed over the first interlayer dielectric layer, wherein the first contact plugs contact the first conductive lines over the second interlayer dielectric layer by passing through the first and second interlayer dielectric layers, and wherein the second contact plugs contact the second conductive lines over the first interlayer dielectric layer by passing through the first interlayer dielectric layer.

9. The nonvolatile memory device according to claim 7, wherein the floating gates are coupled in response to a voltage applied to the first contact plugs.

10. The nonvolatile memory device according to claim 7, wherein a coupling ratio between the floating gates and the first contact plugs increases as the distance between the first contact plugs and the floating gates decreases.

11. The nonvolatile memory device according to claim 7, wherein the first contact plug is a bar type and the second contact plug is a hole type.

12. A nonvolatile memory device comprising:
a substrate having a plurality of active regions;
floating gates formed over the respective active regions;
contact plugs formed on first sides of the floating gates and disposed parallel to the floating gates with gaps defined therebetween;
spacers formed on sidewalls of the floating gates and filling the gaps;
first conductive lines each contacting a plurality of contact plugs which are arranged in a first direction; and
second conductive lines each connecting a plurality of active regions which are arranged in a second direction crossing the first conducive lines,
wherein the first contact plug and the floating gate have a sufficiently large overlapping area to enable the first contact plug to operate as a control gate for the floating gate.

13. The nonvolatile memory device according to claim 12, further comprising:
an interlayer dielectric layer formed over an upper surface of the substrate;
wherein the contact plugs are coupled to the first conductive lines over the interlayer dielectric layer by passing through the interlayer dielectric layer.

14. The nonvolatile memory device according to claim 12, further comprising:
junction regions formed in the active regions on the first sides of the floating gates and second opposing sides of the floating gates,
wherein the second conductive lines comprise connection parts which connect junction regions which are formed on the second sides of the floating gates.

15. The nonvolatile memory device according to claim 14, wherein the connection parts comprise impurity regions which are formed in the substrate.

16. The nonvolatile memory device according to claim 12, wherein the contact plugs have sidewalls which face sidewalls of the floating gates.

17. The nonvolatile memory device according to claim 12, wherein the floating gates are coupled in response to a voltage applied to the contact plugs.

18. The nonvolatile memory device according to claim 12, wherein a coupling ratio between the floating gates and the contact plugs increases as a width of the gaps decreases.

19. The nonvolatile memory device according to claim 12, wherein the first contact plug is a bar type and the second contact plug is a hole type.

20. A nonvolatile memory device comprising:
a select gate formed over a substrate;
a floating gate formed over the substrate and adjacent to the select gate;
a spacer formed on sidewalls of the floating gate and the select gate; and
a contact plug contacting a portion of the spacer adjacent to the floating gate,
wherein the first contact plug and the floating gate have a sufficiently large overlapping area to enable the first contact plug to operate as a control gate for the floating gate.

21. The nonvolatile memory device according to claim 20, wherein the contact plug has a sidewall which faces a sidewall of the floating gate.

22. The nonvolatile memory device according to claim 20, wherein the floating gate is coupled in response to a voltage applied to the contact plug.

23. The nonvolatile memory device according to claim 20, wherein the first contact plug is a bar type and the second contact plug is a hole type.

* * * * *